United States Patent
Jin et al.

(10) Patent No.: US 12,245,402 B2
(45) Date of Patent: Mar. 4, 2025

(54) MOBILE TERMINAL, VAPOR CHAMBER AND PREPARATION METHOD THEREOF, AND ELECTRONIC DEVICE

(71) Applicant: Honor Device Co., Ltd., Shenzhen (CN)

(72) Inventors: Linfang Jin, Shenzhen (CN); Qiu Chen, Shenzhen (CN); Yonglu Liu, Shenzhen (CN); Chenji Niu, Shenzhen (CN); Jiaju Liu, Shenzhen (CN)

(73) Assignee: Honor Device Co., Ltd., Shenzhen (CN)

( * ) Notice: Subject to any disclaimer, the term of this patent is extended or adjusted under 35 U.S.C. 154(b) by 262 days.

(21) Appl. No.: 17/755,121

(22) PCT Filed: Jan. 12, 2021

(86) PCT No.: PCT/CN2021/071267
§ 371 (c)(1),
(2) Date: Sep. 26, 2022

(87) PCT Pub. No.: WO2021/143674
PCT Pub. Date: Jul. 22, 2021

(65) Prior Publication Data
US 2023/0019481 A1    Jan. 19, 2023

(30) Foreign Application Priority Data

Jan. 14, 2020   (CN) .......................... 202010038900.0

(51) Int. Cl.
*H05K 7/20*       (2006.01)
*G06F 1/20*       (2006.01)
*H04M 1/02*       (2006.01)

(52) U.S. Cl.
CPC ........... *H05K 7/20336* (2013.01); *G06F 1/20* (2013.01); *H04M 1/0206* (2013.01)

(58) Field of Classification Search
CPC ............... F28D 15/046; F28D 15/0233; F28D 2021/0028; H01L 23/427; H05K 7/20336; H05K 7/20254; G06F 1/20
See application file for complete search history.

(56) References Cited

U.S. PATENT DOCUMENTS

2009/0040726 A1*  2/2009  Hoffman ............. F28D 15/0233
                                                    29/890.032
2010/0319881 A1   12/2010  Wang
(Continued)

FOREIGN PATENT DOCUMENTS

CN        101666586 A     3/2010
CN        201569346 U     9/2010
(Continued)

*Primary Examiner* — Mandeep S Buttar
(74) *Attorney, Agent, or Firm* — Slater Matsil, LLP

(57) ABSTRACT

A vapor chamber and a mobile terminal are provided. The vapor chamber comprises a first cover plate, a second cover plate, a housing including the first cover plate and the second cover plate, wherein the first cover plate and the second cover plate are connected to form a sealed cavity, a cooling medium, a capillary structure disposed in the sealed cavity, and a supporting structure extending from an inner surface of the housing to an internal space of the housing. A material of the first cover plate and the second cover plate is a high-strength composite material, wherein the high-strength composite material comprises a first material layer and a second material layer. The vapor chamber has light weight, small thickness and structural strength.

16 Claims, 22 Drawing Sheets

(56) References Cited

U.S. PATENT DOCUMENTS

| | | |
|---|---|---|
| 2010/0326630 A1 | 12/2010 | Wang |
| 2014/0063773 A1* | 3/2014 | Gilbert .................. G06F 1/1656 361/816 |
| 2017/0248378 A1 | 8/2017 | Aoki et al. |
| 2018/0202723 A1 | 7/2018 | Huang et al. |
| 2019/0116698 A1 | 4/2019 | Lee |
| 2019/0204019 A1 | 7/2019 | Liu et al. |
| 2020/0326134 A1* | 10/2020 | Chen .................... H01L 23/427 |
| 2021/0007238 A1* | 1/2021 | Sun ....................... H04M 1/026 |
| 2022/0293882 A1* | 9/2022 | Vishakantaiah ... H10K 59/8794 |
| 2023/0019481 A1 | 1/2023 | Jin et al. |

FOREIGN PATENT DOCUMENTS

| | | | |
|---|---|---|---|
| CN | 101927426 A | 12/2010 |
| CN | 201706933 U | 1/2011 |
| CN | 101970967 A | 2/2011 |
| CN | 101995182 A | 3/2011 |
| CN | 102019543 A | 4/2011 |
| CN | 102052864 A | 5/2011 |
| CN | 102623421 A | 8/2012 |
| CN | 203337002 U | 12/2013 |
| CN | 105828570 A | 8/2016 |
| CN | 205546375 U | 8/2016 |
| CN | 107306486 A | 10/2017 |
| CN | 107782185 A | 3/2018 |
| CN | 108323137 A | 7/2018 |
| CN | 207881538 U | 9/2018 |
| CN | 109612316 A | 4/2019 |
| CN | 110234212 A | 9/2019 |
| CN | 110285699 A | 9/2019 |
| CN | 209563090 U | 10/2019 |
| CN | 110402068 A | 11/2019 |
| CN | 110418550 A | 11/2019 |
| CN | 110440621 A | 11/2019 |
| CN | 209643232 U | 11/2019 |
| CN | 110678048 A | 1/2020 |
| CN | 209894013 U | 1/2020 |
| CN | 111163621 A | 5/2020 |
| CN | 210512786 U | 5/2020 |
| CN | 210892824 U | 6/2020 |
| CN | 111829380 A | 10/2020 |
| JP | S5941898 A | 3/1984 |
| JP | H039552 A | 1/1991 |
| JP | 2015041768 A | 3/2015 |
| KR | 101508877 B1 | 4/2015 |
| RU | 2297661 C2 | 4/2007 |
| RU | 2639635 C1 | 12/2017 |

\* cited by examiner

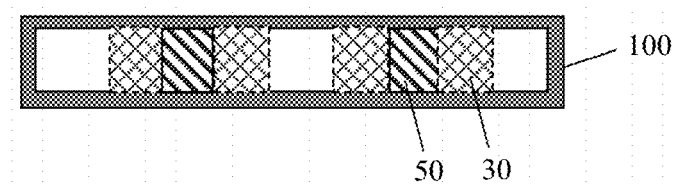
FIG. 17
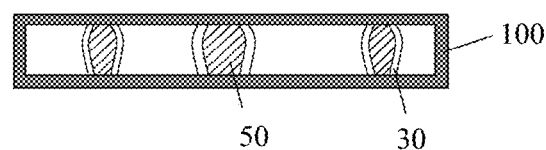
FIG. 18
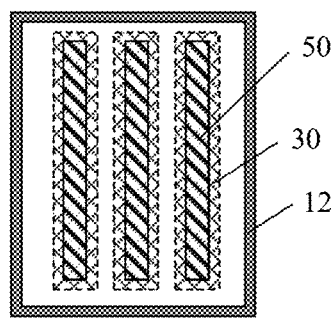 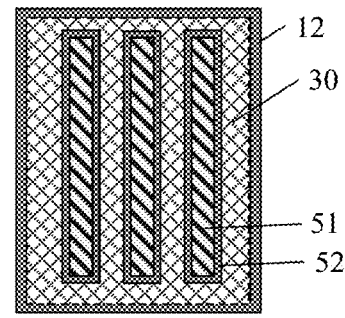
FIG. 19a          FIG. 19b
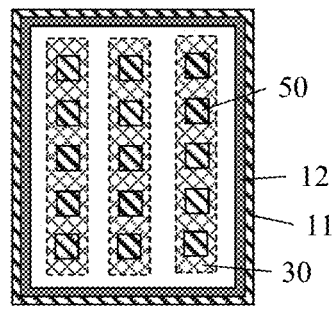 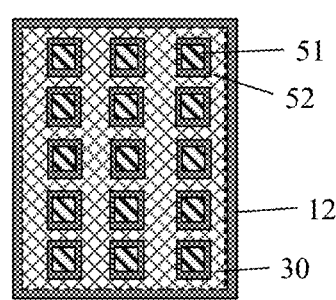
FIG. 20a          FIG. 20b

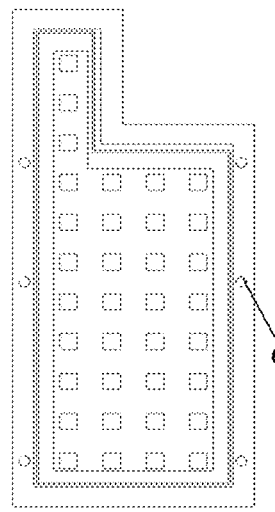
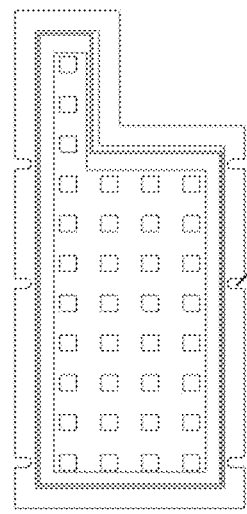
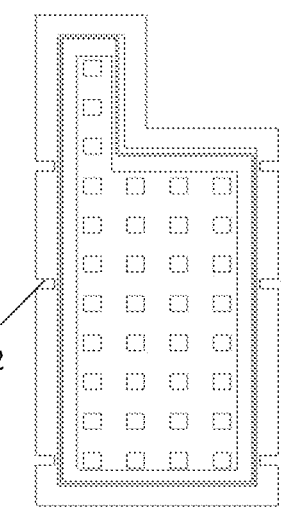
FIG. 22a     FIG. 22b     FIG. 22c
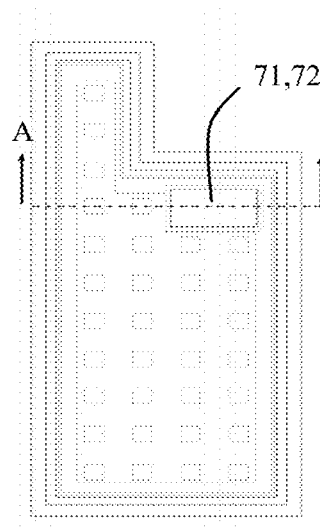
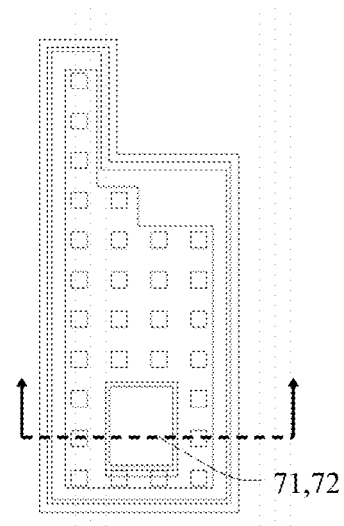
FIG. 23a     FIG. 23b

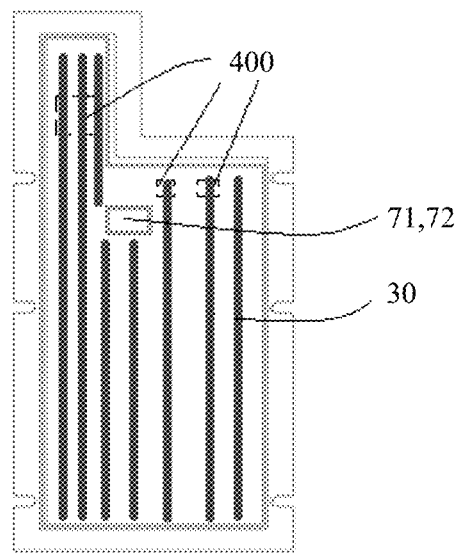
FIG. 28a
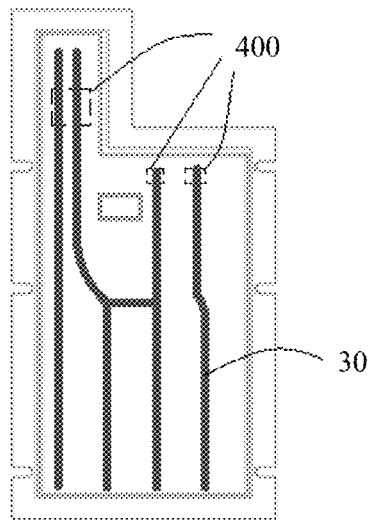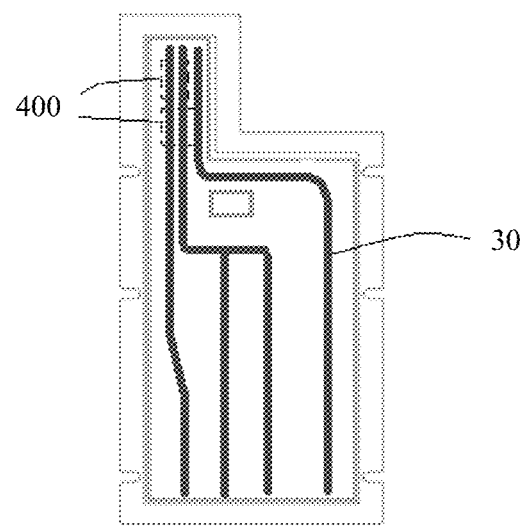
FIG. 28b            FIG. 28c

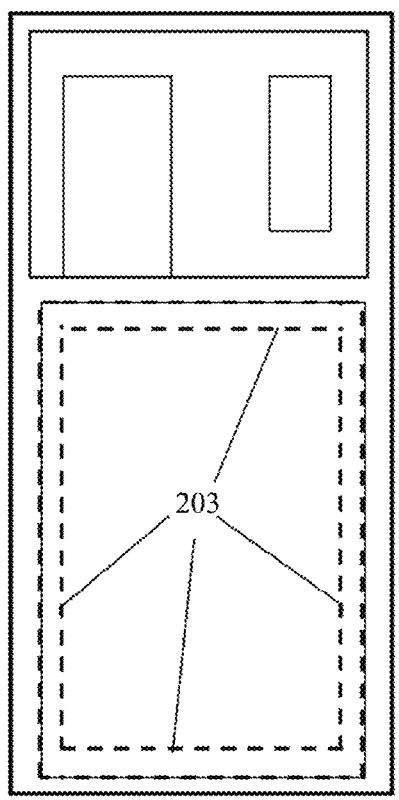 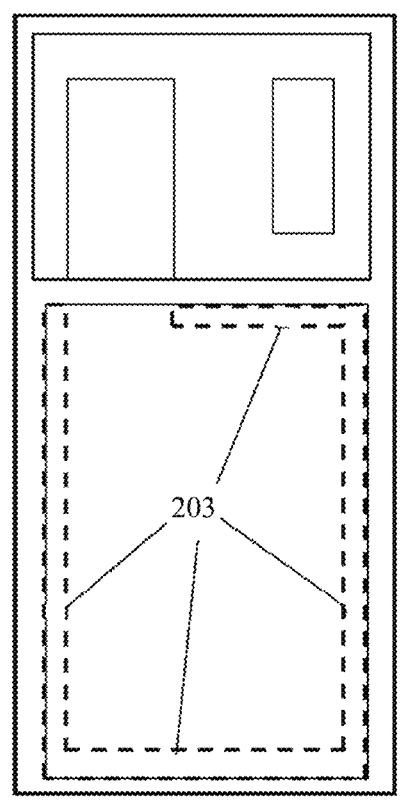
FIG. 30aFIG. 30b

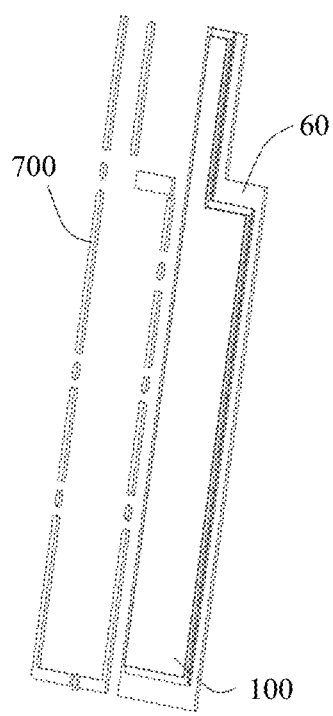 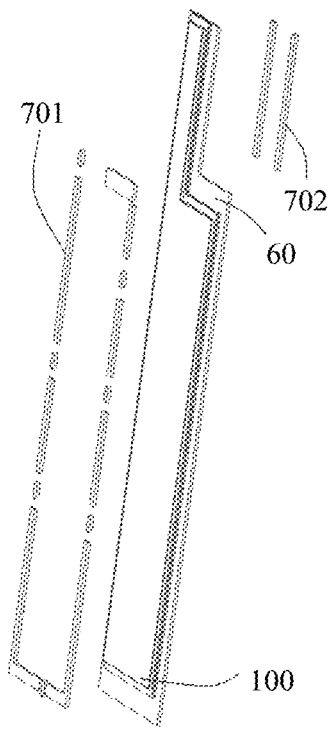
FIG. 32a  FIG. 32b
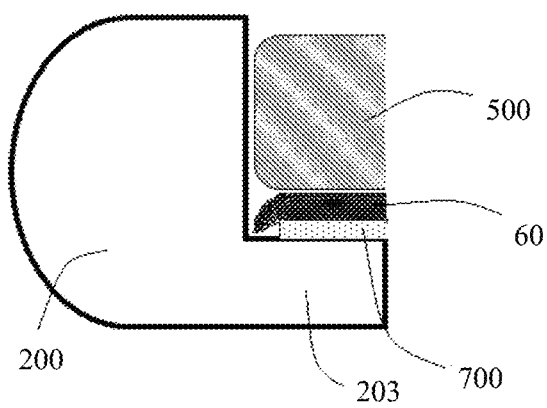
FIG. 33

MOBILE TERMINAL, VAPOR CHAMBER AND PREPARATION METHOD THEREOF, AND ELECTRONIC DEVICE

CROSS-REFERENCE TO RELATED APPLICATIONS

This application is a National Stage of International Application No. PCT/CN2021/071267, filed on Jan. 12, 2021, which claims priority to Chinese Patent Application No. 202010038900.0, filed on Jan. 14, 2020. The disclosures of which are incorporated herein by reference in their entireties.

TECHNICAL FIELD

This application relates to the field of mobile terminal technologies, and in particular, to a mobile terminal, a vapor chamber and a preparation method thereof, and an electronic device.

BACKGROUND

Currently, features such as light weight, small thickness and portability of terminal electronic products have become highlights. To reduce a thickness of an entire mobile terminal, a hole is formed in a part of a middle frame, and a vapor chamber is embedded in the middle frame. However, strength of an entire structure of the middle frame is decreased after the hole formation. Existing vapor chambers also tend to have a light weight, a small thickness, a large area, and a large span. However, a plate material with a small thickness or a large area and a large span decreases structural strength of the vapor chamber, the vapor chamber is always prone to deformation under the action of bending, twisting, pressing, or the like, and a cooling function thereof is affected. Therefore, how to improve stability of an entire structure of a mobile terminal without affecting cooling becomes a design focus.

SUMMARY

To resolve the problem existing in the prior art, this application provides a mobile terminal, a vapor chamber and a preparation method thereof, and an electronic device. The vapor chamber and the middle frame are combined for use as a structural supporting member, so as to improve structural strength of the vapor chamber and improve overall structural stability of the mobile terminal without affecting cooling.

According to a first aspect, this application provides a mobile terminal, including a middle frame, a display screen, a circuit board, and a battery. The mobile terminal further includes a vapor chamber. The vapor chamber includes:

a housing, where the housing includes a first cover plate and a second cover plate, the first cover plate and the second cover plate are connected in a sealed manner to form a sealed cavity, an interior of the sealed cavity is a negative pressure environment, and a cooling medium is provided; and a capillary structure, where the capillary structure is disposed in the sealed cavity; a material of the first cover plate and/or the second cover plate is a high-strength composite material, the high-strength composite material includes at least one first material layer and at least one second material layer, a material of the first material layer is at least one of stainless steel, titanium, titanium alloy, tungsten, tungsten alloy, chromium, and chromium alloy, and a material of the second material layer is copper or copper alloy; and the second material layer is located on an inner side of the housing to separate the first material layer from the cooling medium; and a through-hole is provided in the middle frame, and the vapor chamber is embedded in the through-hole; and the vapor chamber and the middle frame jointly bear the display screen, the circuit board, and the battery.

With reference to the first aspect, in a feasible implementation, a connection manner of the vapor chamber and the middle frame includes any one or more of riveting, bonding, welding, lapping, and metal over-molding.

With reference to the first aspect, in a feasible implementation, the middle frame includes a middle frame side wall and a middle frame extension member, where the middle frame extension member is connected to a side of the middle frame side wall facing towards the through-hole.

With reference to the first aspect, in a feasible implementation, the vapor chamber further includes a step fixing part formed by extending along at least a part of an edge of the vapor chamber, where the step fixing part is connected to the middle frame extension member.

With reference to the first aspect, in a feasible implementation, in a thickness direction of the mobile terminal, a sum of a thickness of the middle frame extension member and a thickness of the step fixing part is greater than or equal to a thickness of the vapor chamber.

With reference to the first aspect, in a feasible implementation, the mobile terminal further includes a connecting layer for connecting the step fixing part to the middle frame extension member, where a sum of a thickness of the middle frame extension member, a thickness of the connecting layer, and a thickness of the step fixing part is greater than or equal to a thickness of the vapor chamber.

With reference to the first aspect, in a feasible implementation, holes and/or slots are provided in the step fixing part.

With reference to the first aspect, in a feasible implementation, the vapor chamber is provided with a mounting recess and/or a mounting hole in a thickness direction.

With reference to the first aspect, in a feasible implementation, the mounting recess is formed in the first cover plate or the second cover plate by recessing the vapor chamber in the thickness direction; or the mounting hole runs through the first cover plate and/or the second cover plate.

With reference to the first aspect, in a feasible implementation, several electrical connection points are arranged on the middle frame extension member and/or the step fixing part.

With reference to the first aspect, in a feasible implementation, the vapor chamber includes a first section, a second section, and a bent section connected to the first section and the second section, where the first section and the second section have a height difference, and the capillary structure keeps continuous in the first section, the second section, and the bent section.

With reference to the first aspect, in a feasible implementation, the mobile terminal further includes a cooling layer and a heating device, where the heating device is sandwiched between the vapor chamber and the cooling layer to form a sandwich cooling structure.

With reference to the first aspect, in a feasible implementation, the battery and the display screen are disposed on two sides of the vapor chamber in parallel respectively, and the vapor chamber includes a battery surface facing towards the battery and a display surface facing towards the display screen, where the display screen and the display surface are parallel without contact.

With reference to the first aspect, in a feasible implementation, the mobile terminal is a folding mobile terminal, when the mobile terminal is in a folding or bent state, the battery and the display screen are disposed on the two sides of the vapor chamber in parallel respectively, the display screen and the display surface are parallel without contact, and the battery is connected to the middle frame and faces towards the battery surface of the vapor chamber.

With reference to the first aspect, in a feasible implementation, the circuit board and the battery are disposed on a same side of the vapor chamber, and an area of the battery surface of the vapor chamber is greater than a projected area of the battery in a thickness direction.

With reference to the first aspect, in a feasible implementation, the vapor chamber includes an evaporation region and a condensation region, where distribution density of the capillary structure in the evaporation region is greater than distribution density in the condensation region.

With reference to the first aspect, in a feasible implementation, the vapor chamber further includes a supporting structure extending from an inner surface of the housing to an internal space of the housing.

With reference to the first aspect, in a feasible implementation, the supporting structure abuts against the first cover plate and/or the second cover plate.

With reference to the first aspect, in a feasible implementation, a material of an inner core of the supporting structure is the material of the first material layer, and a material of a periphery of the supporting structure is the material of the second material layer.

With reference to the first aspect, in a feasible implementation, a material of the supporting structure is any one of stainless steel, titanium, titanium alloy, tungsten, tungsten alloy, chromium, or chromium alloy.

With reference to the first aspect, in a feasible implementation, the second material layer and the capillary structure are spliced and then disposed on a periphery of the supporting structure in an encircling manner.

With reference to the first aspect, in a feasible implementation, the supporting structure and the housing are an integrated structure, and the supporting structure is a plurality of columns or protruding points arranged in an array.

With reference to the first aspect, in a feasible implementation, the capillary structure is a porous metallic medium.

With reference to the first aspect, in a feasible implementation, the capillary structure is one or more of copper mesh, copper fiber, copper powder, or foamy copper.

With reference to the first aspect, in a feasible implementation, the cooling medium is deionized water.

With reference to the first aspect, in a feasible implementation, the capillary structure is disposed on the second material layer of the first cover plate and/or the second cover plate.

With reference to the first aspect, in a feasible implementation, a surface hardness of the cover plate made of the high-strength composite material is greater than or equal to 120 Hv.

According to a second aspect, this application provides a vapor chamber. The vapor chamber includes:

a housing, where the housing includes a first cover plate and a second cover plate, the first cover plate and the second cover plate are connected in a sealed manner to form a sealed cavity, an interior of the sealed cavity is a negative pressure environment, and a cooling medium is provided; and a capillary structure, where the capillary structure is disposed in the sealed cavity; a material of the first cover plate and/or the second cover plate is a high-strength composite material, the high-strength composite material includes at least one first material layer and at least one second material layer, a material of the first material layer is at least one of stainless steel, titanium, titanium alloy, tungsten, tungsten alloy, chromium, and chromium alloy, and a material of the second material layer is copper or copper alloy; and the second material layer is located on an inner side of the housing to separate the first material layer from the cooling medium.

With reference to the second aspect, in a feasible implementation, the vapor chamber further includes a supporting structure, where the supporting structure extends from an inner surface of the housing to an internal space of the housing.

With reference to the second aspect, in a feasible implementation, a material of an inner core of the supporting structure is the material of the first material layer, and a material of a periphery of the supporting structure is the material of the second material layer.

With reference to the second aspect, in a feasible implementation, the supporting structure abuts against the first cover plate and/or the second cover plate.

With reference to the second aspect, in a feasible implementation, the supporting structure and the housing are an integrated structure, and the supporting structure is a plurality of columns or protruding points arranged in an array.

With reference to the second aspect, in a feasible implementation, the second material layer of the first cover plate and the second material layer of the second cover plate enclose the sealed cavity.

With reference to the second aspect, in a feasible implementation, the high-strength composite material further includes a third material layer, where the first material layer is sandwiched between the second material layer and the third material layer, and a material of the third material layer is copper or copper alloy.

With reference to the second aspect, in a feasible implementation, the capillary structure is a porous metallic medium.

With reference to the second aspect, in a feasible implementation, the capillary structure is one or more of copper mesh, copper fiber, copper powder, or foamy copper.

With reference to the second aspect, in a feasible implementation, the cooling medium is deionized water.

With reference to the second aspect, in a feasible implementation, the capillary structure is disposed on the second material layer of the first cover plate and/or the second cover plate.

With reference to the second aspect, in a feasible implementation, a surface hardness of the cover plate made of the high-strength composite material is greater than or equal to 120 Hv.

With reference to the second aspect, in a feasible implementation, the vapor chamber further includes a step fixing part formed by extending along at least a part of an edge of the vapor chamber.

With reference to the second aspect, in a feasible implementation, holes and/or slots are provided in the step fixing part.

With reference to the second aspect, in a feasible implementation, the vapor chamber is provided with a mounting recess and/or a mounting hole in a thickness direction.

With reference to the second aspect, in a feasible implementation, the mounting recess is formed in the first cover plate or the second cover plate by recessing the vapor chamber in the thickness direction; or
  the mounting hole runs through the first cover plate and/or the second cover plate.

With reference to the second aspect, in a feasible implementation, the vapor chamber includes a first section, a second section, and a bent section connected to the first section and the second section, where the first section and the second section have a height difference, and the capillary structure keeps continuous in the first section, the second section, and the bent section.

With reference to the second aspect, in a feasible implementation, the vapor chamber includes an evaporation region and a condensation region, where distribution density of the capillary structure in the evaporation region is greater than distribution density in the condensation region.

According to a third aspect, this application provides a preparation method of a vapor chamber. The method includes:
  disposing a second material layer on a side of a first material layer to form a first cover plate;
  disposing a second material layer on a side of a first material layer to form a second cover plate, where a material of the first material layer is at least one of stainless steel, titanium, titanium alloy, tungsten, tungsten alloy, chromium, and chromium alloy, and a material of the second material layer is copper or copper alloy;
  disposing a supporting structure on an inner surface of a housing to extend towards an internal space of the housing, where a material of an inner core of the supporting structure is the material of the first material layer, and a material of a periphery of the supporting structure is the material of the second material layer; and
  disposing the capillary structure on the second material layer of the first cover plate or the second material layer of the second cover plate, combining the first cover plate and the second cover plate to form the hollow housing, and injecting the cooling medium into the housing, where the second material layer is located on an inner side of the housing to separate the first material layer from the cooling medium, and
  implementing heat cycling of the cooling medium in the housing by using the capillary structure and a vapor channel.

According to a fourth aspect, this application provides an electronic device, including a working module and a cooling module, where the cooling module includes the vapor chamber according to the second aspect, and the vapor chamber is configured to cool the working module.

With reference to the fourth aspect, in a feasible implementation, the electronic device further includes a middle frame and a display screen, where a through-hole is provided in the middle frame, the vapor chamber is embedded in the through-hole, and the vapor chamber and the middle frame jointly bear the display screen.

BRIEF DESCRIPTION OF THE DRAWINGS

To describe the technical solutions in the embodiments of this application more clearly, the following briefly describes the accompanying drawings required for describing the embodiments. Apparently, the accompanying drawings in the following descriptions merely show some embodiments of this application, and a person of ordinary skill in the art may still derive others drawings from these accompanying drawings without creative efforts.

FIG. 17 is a schematic structural diagram of another vapor chamber according to an embodiment of this application;

FIG. 18 is a schematic structural diagram of another vapor chamber according to an embodiment of this application;

FIG. 19a is a top view of a vapor chamber according to an embodiment of this application;

FIG. 19b is a top view of a vapor chamber according to an embodiment of this application;

FIG. 20a is a top view of a vapor chamber according to an embodiment of this application;

FIG. 20b is a top view of a vapor chamber according to an embodiment of this application;

FIG. 22a to FIG. 22c each are a schematic structural perspective view of a vapor chamber according to an embodiment of this application;

FIG. 23a to FIG. 23d each are a schematic structural perspective view of another vapor chamber according to an embodiment of this application;

FIG. 28a to FIG. 28e each are a perspective view of a vapor chamber according to an embodiment of this application;

FIG. 30a to FIG. 30d each are a schematic structural diagram illustrating distribution of a middle frame extension member of a mobile terminal according to an embodiment of this application;

FIG. 32a and FIG. 32b each are a partial schematic exploded view of a middle frame of a mobile terminal according to an embodiment of this application;

FIG. 33 is a partial sectional schematic diagram of a middle frame of a mobile terminal according to an embodiment of this application.

DETAILED DESCRIPTION OF ILLUSTRATIVE EMBODIMENTS

Figure 1:
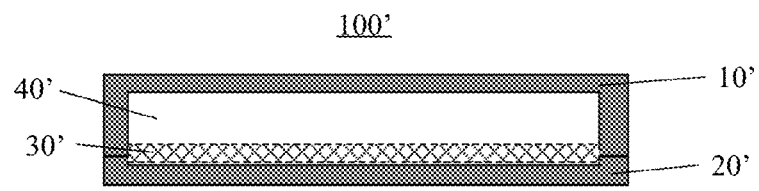
FIG. 1 is a schematic structural diagram of a vapor chamber provided in the prior art.

To make the objectives, technical solutions, and advantages of this application more comprehensible, the following describes this application in detail with reference to embodiments and accompanying drawings. It should be understood that the specific embodiments described herein are merely used to explain this application but are not intended to limit this application.

In the descriptions of this application, unless otherwise specified and defined explicitly, the terms "first" and "second" are merely intended for a purpose of description, and should not be understood as an indication or implication of relative importance; unless otherwise specified and defined, the term "at least one" indicates one or more, and the term "a plurality of" indicates two or more; and the terms "connect", "fix", and the like should be understood in a broad sense. For example, "connect" may be fixedly connect, detachably connect, integrally connect, or electrically connect; and may be directly connect, or indirectly connect by using a medium. A person of ordinary skill in the art can understand specific meanings of these terms in this application based on specific situations.

The term "and/or" in this specification is only an associative relationship for describing associated objects, indicating that three relationships may exist. For example, A and/or B may represent the following three cases: Only A exists, both A and B exist, and only B exists, where A and B may be singular or plural. The symbol "/" generally represents an "or" relationship between associated objects. "At least one of" or other similar expressions represent any combination of these items, including any combination of a singular or a plural. For example, at least one of a, b, or c may represent a, b, c, a-b, a-c, b-c, or a-b-c, where a, b, and c may be singular or plural.

For ease of understanding, some concepts related to the embodiments of this application are explained as examples for reference.

A vapor chamber may generally be called a temperature equalization plate, a heat superconducting plate, or a heat conducting plate. A principle of a vapor chamber (Vapor chamber, VC for short) is similar to that of a heat pipe (Heat pipe). A liquid-phase medium (cooling medium) in a sealed cavity is boiled and transformed into a gas phase for heat absorption, the gas phase is condensed into a liquid phase for heat release, and capillary force, gravitational force, or the like are used as liquid-phase medium conveying power to complete phase transformation cycling of a gas phase and a liquid phase in a cold region and a hot region of the VC, so as to implement efficient heat exchange by using latent heat of phase transformation, heat conduction, convection, or the like. The vapor chamber may be considered as a heat pipe with a higher degree of shape freedom. While an irregular-design and large-span instantaneous pipe is applied to one-dimensional cooling, the vapor chamber may be further applied to two-dimensional cooling and three-dimensional cooling.

The vapor chamber provided in the technical solutions of this application is applied to an electronic device such as a mobile phone, a tablet computer, a laptop, and an associated module, structural part and functional part with a cooling function. The electronic device includes a working module and a cooling module, where the cooling module includes a vapor chamber 100, and the vapor chamber 100 is configured to cool the working module. For the electronic device with the vapor chamber 100 provided in this application, cooling performance and stability are remarkably improved, and requirements for light weight and large area and large span design are also met.

FIG. 1 is a schematic structural diagram of a vapor chamber in the prior art. As shown in FIG. 1, the vapor chamber 100' includes an upper cover plate 10', a lower cover plate 20', a capillary structure 30', a medium (not shown in the figure), and the like. Specifically, the upper cover plate 10' and the lower cover plate 20' of the vapor chamber may be sealed through welding to form a sealed cavity 40', the capillary structure layer 30' may be arranged in the sealed cavity 40', and the capillary structure layer 30' is filled with a certain quantity of the cooling medium (for example, water), so as to form a phase transformation cycling system. A cooling process of the vapor chamber is a two-phase cooling process in which gas-liquid two-phase transformation is performed by using a cooling medium.

It should be understood that, for the vapor chamber, copper or copper alloy is generally used as the upper and lower cover plates, and the capillary structure is generally a copper-based porous medium, for example, copper mesh, sintered copper powder, and foamy copper, and may be generated by using a method such as copper mesh knitting, wire drawing, etching, electroplating, chemical depositing, or the like. The supporting structure may be prepared separately and then fixed to a plate material of the upper and lower cover plates through welding or the like, or may be directly machined on a plate material of the upper and lower cover plates. Currently, a main material is copper. Copper has good thermal conductivity, and also the copper capillary structure is relatively easy to prepare and does not have chemical reaction with water.

Further, the sealed cavity is in a negative pressure state inside, and the sealed cavity is mainly configured to prevent loss of the cooling medium and keep the vacuum negative pressure state, and has a particular deformation-resistant effect. The capillary structure is configured to form capillary force to convey the cooling medium. Completing whole power cycling to complete thermodynamic cycling is a key to keep two phases exchanging heat.

Figure 2:
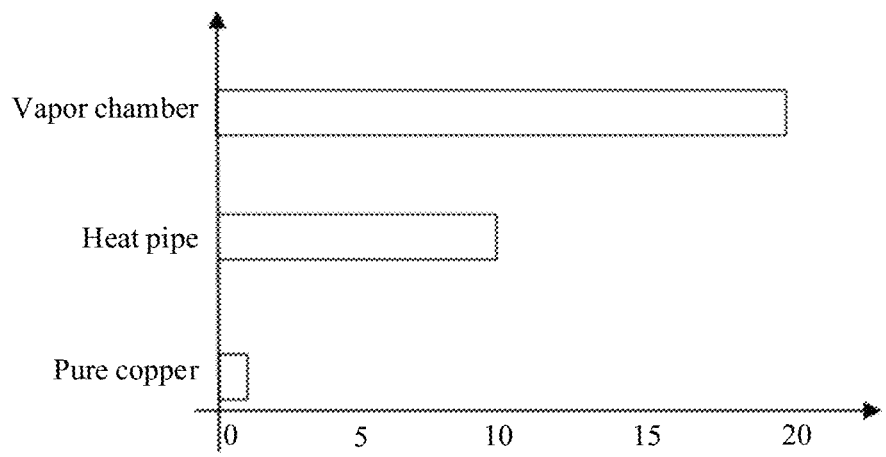
FIG. 2 is a graph contrasting cooling capabilities of a vapor chamber, a heat pipe, and pure copper.

FIG. 2 is a diagram contrasting equivalent heat conduction coefficients of a vapor chamber, pure copper, and a heat pipe. As shown in FIG. 2, for the vapor chamber, liquid water absorbs heat in a heat source to be evaporated into vapor and absorbs a large amount of latent heat. The vapor moves in the sealed cavity to a cold end to release heat and is condensed into liquid water. Then the liquid water flows back to an evaporation section by using the capillary structure. Through phase transformation heat exchange, the equivalent heat conduction coefficient of the vapor chamber is more than 20 times that of the pure copper.

However, a material of the upper and lower cover plates of the existing vapor chamber is copper or copper alloy, which is prone to deformation. Under external acting force such as bending, twisting and stretching and internal pressure such as curing and swelling of an internal medium, the vapor chamber is prone to deformation, causing adverse effects to the electronic device that uses the vapor chamber.

To improve deformation-resistant capability of the vapor chamber, one of stainless steel, titanium, titanium alloy, tungsten, tungsten alloy, chromium, or chromium alloy may be used to prepare the upper and lower cover plates and/or the supporting structure. The supporting structure is disposed between the upper and lower cover plates, so as to improve deformation-resistant capability of the entire vapor chamber. Table 1 shows contrastive physical parameters of several common high-strength metal materials. Table 2 shows a comparison of performance parameters of vapor chambers made of stainless steel or copper alloy.

TABLE 1

Physical parameters (at normal temperature) of metal materials

| Physical parameters | Copper Cu | Copper alloy C5191 | Stainless steel SUS304 | Titanium Ti | Aluminum alloy Al6063 |
|---|---|---|---|---|---|
| Heat conduction coefficient (W/mk) | 385 | 65.8 | 16.3 | 21.9 | 167 |
| Density (g/cm³) | 8.96 | 8.84 | 7.9 | 4.6 | 2.7 |
| Melting point (° C.) | 1080 | 1080 | 1400 | 1660 | 650 |
| Yield strength (Mpa) | 170 | 380 | 385 | 480 | 300-350 |
| Elasticity modulus (Gpa) | 118 | 110 | 200 | 148 | 68.2 |
| Surface hardness (Hv) | 85 | 160 | 180 | 180 | ≥100 |

As shown in Table 1, yield strength, elasticity modulus, and surface hardness of stainless steel and titanium are all greater than those of copper or copper alloy.

TABLE 2

Comparison of performance parameters of vapor chambers made of stainless steel or copper alloy

| Surface material | | Copper alloy | Stainless steel |
|---|---|---|---|
| Test force (gf) | | 100 | 100 |
| Duration (s) | | 10 | 10 |
| Surface hardness (Hv) | Test 1 | 82.91 | |
| | Test 2 | 83.22 | 156.54 |
| | Test 3 | 78.49 | 161.43 |
| | Average | 81.5 | 159 |

As shown in Table 2, for the vapor chamber made of stainless steel, a surface hardness (159 Hv) of stainless steel is greater than a surface hardness (81.5 Hv) of copper alloy, which is an increase of 95% than the latter.

Figure 3:
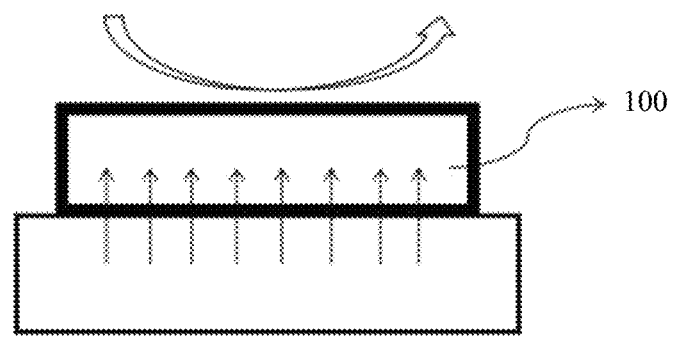
FIG. 3 is a schematic diagram of a cooling mechanism of a vapor chamber according to an embodiment of this application.

For better understanding of the technical solutions, a working principle of the embodiments is described herein first. FIG. 3 is a schematic diagram of a working principle of a vapor chamber provided in an embodiment of this application. As shown in FIG. 3, the vapor chamber 100 includes an evaporation region and a cooling region, where the two regions are determined based on specific requirements of working scenarios, may be an entire upper cover plate or an entire lower cover plate respectively, or may be a part of the upper cover plate or the lower cover plate. When heat is conducted from a heat source to the evaporation region of the vapor chamber 100, a cooling medium in a sealed cavity is heated in a low-vacuum environment and starts to be evaporated, and also absorbs heat energy for rapid volume expansion, the entire sealed cavity is rapidly filled with the gas-phase cooling medium, and the gas-phase cooling medium enters the cooling region to be condensed. During condensation, the heat accumulated in evaporation is released, and the condensed cooling medium returns to the evaporation heat source by using the capillary structure. This operation is cyclically performed in the sealed cavity.

Therefore, a cooling function of the vapor chamber is mainly implemented through gas-liquid two-phase transformation of the cooling medium. A cooling process of the vapor chamber includes four major steps: conduction, evaporation, convection, and condensation. Evaporation inside the vapor chamber is continuously performed, and as temperature changes, internal pressure of the vapor chamber keeps balance correspondingly. The vapor chamber is large in size range and flexible in layout, and size of the vapor chamber may be designed based on actual size and distribution of the heat source, so that the heat source is flexibly covered, and a plurality of heat sources are simultaneously cooled.

It may be learned from the foregoing working principle that, the vapor chamber 100 in the embodiments provides a sealed space, in which gas-liquid two-phase transformation of the cooling medium is performed. Considering that different cooling mediums have different capabilities of releasing phase transformation potentials during gas-liquid two-phase transformation, water is generally selected as the cooling medium.

However, in a long-term use process, a compatibility problem exists between stainless steel and water, and the compatibility problem means the problem that a plate material of a housing and a working medium react to generate non-condensable gas, causing failure of the vapor chamber of a two-phase cooling system. As shown in Formula 1 and Formula 2, the non-condensable gas (such as $H_2$ or $O_2$) continuously breaks a negative pressure environment in the vapor chamber, causing the vapor chamber unable to normally work and failure. When an internal space of the vapor chamber is relatively large, a space can be reserved to accommodate the non-condensable gas $H_2$; and when a thickness of the vapor chamber is extremely small, space is limited and cannot be reserved, so that the non-condensable gas breaks the negative pressure environment. Therefore, the vapor chamber is seldom prepared from stainless steel and water in combination.

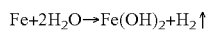  Formula 1:

Above 120° C., $Fe(OH)_2$ decomposes, and Formula 2: $3Fe(OH)_2 \rightarrow Fe_3O_4 + H_2\uparrow + 2H_2O$.

Copper has good thermal conductivity, and also the copper capillary structure is relatively easy to prepare and does not have chemical reaction with water, so that a negative pressure environment is not broken. Therefore, for the copper-based or copper-alloy-based vapor chamber, durability of the vapor chamber can be improved.

For the problems existing in the prior art, the following continues to discuss the technical solutions of the embodiments of this application.

Figure 4:
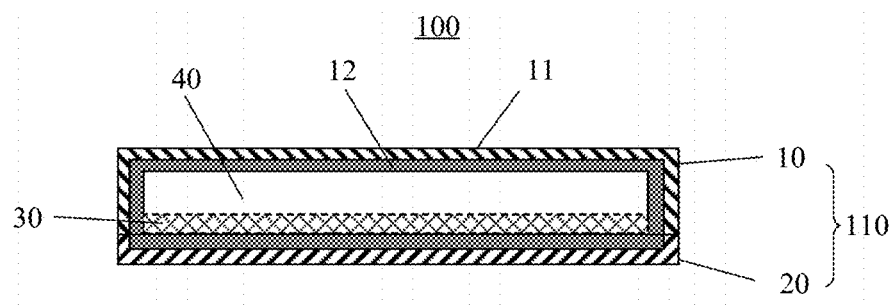
FIG. 4 is a schematic structural diagram of a vapor chamber according to an embodiment of this application.

An embodiment of this application provides a high-temperature vapor chamber. It should be noted that, in practice, the vapor chamber may be designed, based on products, to be unequal in thickness and irregular, and is not limited to cuboid. FIG. 4 is an overall schematic structural diagram of a high-strength vapor chamber according to an embodiment of this application. As shown in FIG. 4, the vapor chamber 100 includes a housing 110 and a capillary structure 30. The housing 110 includes a first cover plate 10 and a second cover plate 20, where the first cover plate 10 and the second cover plate 20 are connected in a sealed manner to form a sealed cavity 40. An interior of the sealed cavity 40 is a negative pressure environment, and a cooling medium is provided. Further, with an opening provided in the housing 110, the sealed cavity 40 may be vacuumized in advance, and the cooling medium such as deionized water, methanol, or acetone is injected.

Figure 5:
FIG. 5 is a schematic structural diagram of a high-strength composite material according to an embodiment of this application.
Figure 6:
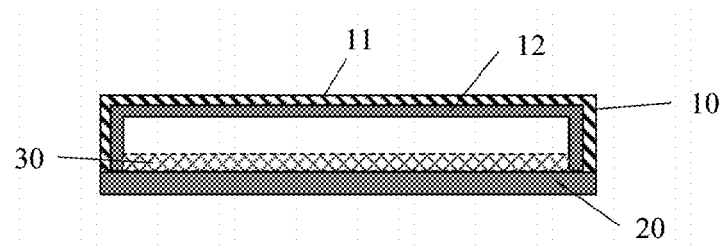
FIG. 6 is a schematic structural diagram of another vapor chamber according to an embodiment of this application.
Figure 7:
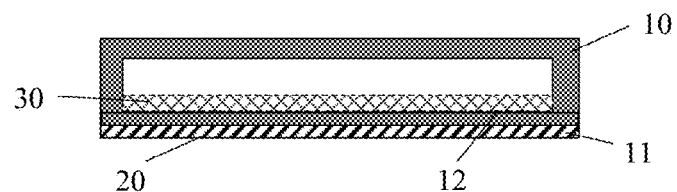
FIG. 7 is a schematic structural diagram of another vapor chamber according to an embodiment of this application.
Figure 8:
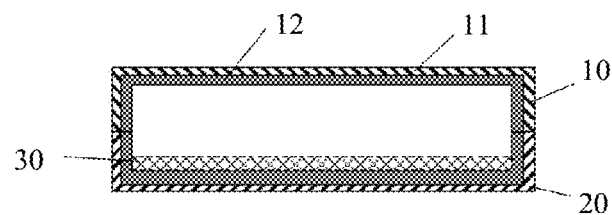
FIG. 8 is a schematic structural diagram of another vapor chamber according to an embodiment of this application.
Figure 9:
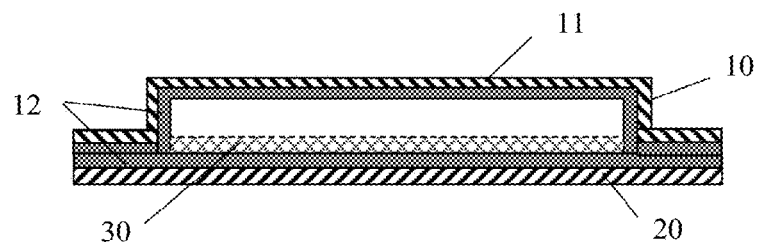
FIG. 9 is a schematic structural diagram of another vapor chamber according to an embodiment of this application.

As shown in FIG. 5, a material of the first cover plate 10 and/or the second cover plate 20 is a high-strength composite material, the high-strength composite material includes at least one first material layer 11 and at least one second material layer 12, a material of the first material layer 11 is at least one of stainless steel, titanium, titanium alloy, tungsten, tungsten alloy, chromium, and chromium alloy, and a material of the second material layer 12 is copper or copper alloy. The second material layer 12 is located on an inner side of the housing 110, and the first material layer 11 is not in contact with the cooling medium.

Specifically, the first material layer and the second material layer may be laminated through vacuum hot rolling, vacuum cold rolling, vacuum diffusion welding, or the like to form the high-strength composite material, or at least one surface of the first material layer may be covered with the second material layer through treatment such as electroplating and chemical depositing on the first material layer.

For example, the high-strength composite material may include a first material layer 11 and a second material layer 12, where the first material layer 11 may be formed by laminating a stainless steel layer, a titanium layer, and a titanium alloy layer. The first material layer 11 is prepared from a plurality of metal layers of different densities by using a lamination process such as electroplating, rolling and bonding. Certainly, the high-strength composite material may alternatively be prepared by using a lamination process such as electroplating, rolling and bonding.

Further, the first cover plate 10 and the second cover plate 20 may be different in thickness. For example, to improve strength of the vapor chamber, when the vapor chamber is applied to the electronic device, a thickness of the cover plate facing towards a battery surface may be greater than a thickness of the cover plate facing towards a display surface. It may be understood that the cover plate made of the high-strength composite material may be used as a reinforcing structure for a middle frame, this can avoid that the middle frame with a large area hollowed out is provided with strength only by a middle frame side wall, causing a great decline of strength, and especially for a curved screen and a widened antenna gap, the middle frame side wall is thinned, meaning that with optimization and reinforcement of the vapor chamber 100, rigidity of the middle frame can meet use requirements.

In this embodiment, a surface hardness of the cover plate made of the high-strength composite material is greater than or equal to 120 Hv, and specifically may be 120 Hv, 150 Hv, 170 Hv, 180 Hv, 200 Hv, 220 Hv, 250 Hv, or the like. This is not limited herein.

The capillary structure 30 is disposed in the sealed cavity 40. Specifically, the capillary structure 30 may be parallel to the first cover plate 10 and the second cover plate 20, or may be arranged based on design requirements. This is not limited herein. The capillary structure 30 is filled with the cooling medium, where the cooling medium may be, for example, deionized water, methanol, or acetone. Cooling of the vapor chamber may be implemented through gas-liquid two-phase transformation of the working medium. A specific cooling principle and cooling path of the capillary structure are described as above.

The capillary structure 30 may be connected to an inner surface of the housing no, or may not be connected to an inner surface of the housing no. The capillary structure 30 is a porous metallic medium. Specifically, a material of the capillary structure is copper or copper alloy, and the capillary structure may be, for example, one or more of copper mesh, copper fiber, copper powder, or foamy copper.

Specifically, the capillary structure 30 may be disposed on the second material layer 12 of the first cover plate 10 and/or the second cover plate 20. In a specific implementation, the copper mesh may be combined with a surface of the first cover plate 10 facing towards the second cover plate 20 through sintering, soldering, cold pressing, or the like. The copper mesh is fixed to the inner surface of the housing no, to be specific, the second material layer 12 of the first cover plate 10 or the second material layer 12 of the second cover plate 20 through sintering, soldering, cold pressing, or the like, so that the copper mesh is prevented from displacement in use, and working stability of a product is ensured.

In other embodiments, the copper mesh may alternatively be placed in the sealed cavity 40 without any connection processing, so as to prevent the housing 110 from being affected by sintering, soldering, cold pressing, or the like, and ensure structural stability of the housing 110.

In a specific embodiment, the sealed cavity 40 of the vapor chamber is provided with an opening that communicates with the outside. The opening may be a liquid injection opening or a vacuumizing opening. Injecting the cooling medium into the sealed cavity 40 through the opening, performing vacuumizing treatment on the sealed cavity 40 through the opening and then sealing the opening allow for a vacuum negative pressure state of the sealed cavity 40. When the sealed cavity 40 is vacuumized, the injected cooling medium is under negative pressure, and the cooling medium is evaporated once being heated in the evaporation region. The evaporated cooling medium swells to fill the entire cavity, in the cooling region, the gas cooling medium releases heat and is liquefied into a liquid cooling medium, and the liquefied cooling medium returns to the evaporation region by using the capillary structure 30. In this way, a heat transfer cycle is formed in the sealed cavity 40.

For the vapor chamber provided in this embodiment, strength of the vapor chamber can be improved, and also the high-strength material (such as stainless steel) can be separated from a medium such as water, so as to greatly mitigate or eliminate a compatibility problem.

FIG. 6 to FIG. 9 each are a schematic structural diagram of a vapor chamber according to an embodiment of this application. It may be understood that the first cover plate 10 or the second cover plate 20 made of the high-strength composite material can increase strength and deformation-resistant capability of the vapor chamber. Shape, edge sealing form, connection manner, and the like of the first cover plate 10 and the second cover plate 20 may all be correspondingly designed and changed based on actual needs. The first cover plate 10 and/or the second cover plate 20 made of the high-strength composite material can improve strength and deformation-resistant capability of the vapor chamber. The second material layer 12 made of the high-strength composite material is disposed on the inner side of the housing 110, so that the first material layer 11 can be separated from a medium such as water, thereby greatly mitigating or eliminating a compatibility problem and preventing non-condensable gas that breaks a negative pressure environment from being generated by reaction of water and stainless steel. It should be noted that, in the solution shown in FIG. 6, the second cover plate 20 may only include a second material layer, excluding a first material layer. In the solution shown in FIG. 7, the first cover plate 10 may only include a second material layer, excluding a first material layer.

Figure 10:
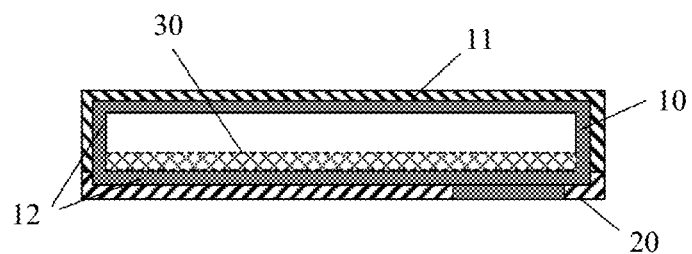
FIG. 10 is a schematic structural diagram of another vapor chamber according to an embodiment of this application.

FIG. 10 is a schematic structural diagram of another vapor chamber according to an embodiment of this application. As shown in FIG. 10, the high-strength composite material is not limited to the first material layer 11 and the second material layer 12 that are stacked, the first material layer 11 and the second material layer 12 may be spliced, and the splicing manner may be partial splicing or full splicing. The first material layer 11 and the second material layer 12 may be the same or different in area, and each first material layer 11 and each second material layer 12 may be the same or different in thickness.

Figure 11:
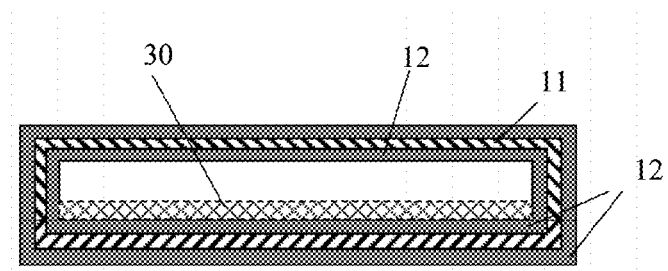
FIG. 11 is a schematic structural diagram of another vapor chamber according to an embodiment of this application.

FIG. 11 is a schematic structural diagram of another vapor chamber according to an embodiment of this application. As shown in FIG. 11, the high-strength composite material further includes a third material layer, where the first material layer is sandwiched between the second material layer and the third material layer, and a material of the third material layer is copper or copper alloy. With the sandwich structure, deformation-resistant capability of the entire housing is improved. The second material layer 12 and the third material layer 13 may be the same or different in thickness. A thickness of the first cover plate and a thickness of the second cover plate each are less than or equal to 0.15 mm. Shape, edge sealing form, connection manner, and the like of the first cover plate and the second cover plate may all be correspondingly designed and changed based on actual needs.

In an implementation, the cooling medium is deionized water. It may be understood that, water that serves as the most commonly used cooling medium and that is low in production cost and easy to prepare facilitates reducing production costs of the entire vapor chamber, and compared with methanol, acetone, and the like, water as the cooling medium is safer and more reliable.

Figure 12:
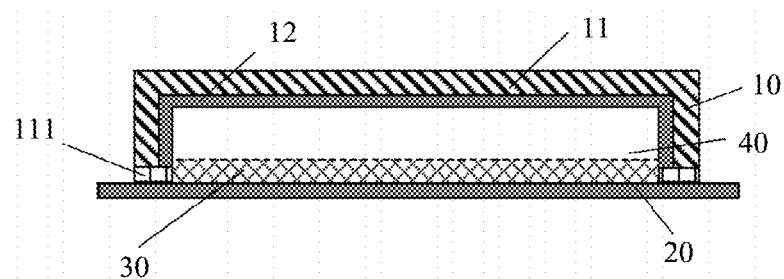
FIG. 12 is a schematic structural diagram of another vapor chamber according to an embodiment of this application.

FIG. 12 is a schematic structural diagram of another vapor chamber according to an embodiment of this application. As shown in FIG. 12, in an actual preparation process, the first cover plate 10 and the second cover plate 20 may be connected in a sealed manner through welding, bonding, or the like to form the sealed cavity 40. Specifically, the second material layer 12 of the first cover plate 10 and the second material layer 12 of the second cover plate 20 enclose the sealed cavity 40, so as to prevent the cooling medium from contact with the first material layer 11.

In this embodiment, the housing no of the vapor chamber 100 further includes a fusion layer 111, where the fusion layer 111 is configured to connect the first cover plate 10 and the second cover plate 20, so as to connect the first cover plate 10 and the second cover plate 20 in a sealed manner to form the sealed cavity 40, meaning that the fusion layer 111 may be a welding layer or a bonding layer formed through a treatment process such as welding or bonding.

Figure 13:
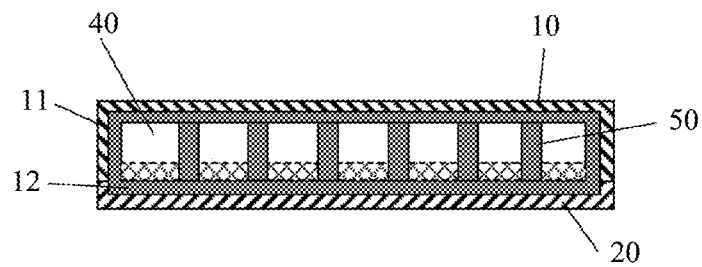
FIG. 13 is a schematic structural diagram of another vapor chamber according to an embodiment of this application.

FIG. 13 is a schematic structural diagram of another vapor chamber according to an embodiment of this application. As shown in FIG. 13, the vapor chamber 100 further includes a supporting structure 50, where the supporting structure 50 may be configured to keep the shape of the housing no and improve strength of the vapor chamber.

The supporting structure 50 extends from an inner surface of the housing no to an internal space of the housing no. A channel between the supporting structure 50 is a vapor channel and/or a capillary structure. It may be understood that the supporting structure can be configured to prevent the vapor chamber from deformation caused by atmospheric pressure difference between inside and outside and other external force, so as to prevent the vapor channel and the capillary structure from being crushed and causing the vapor chamber to fail.

Specifically, the supporting structure 50 is disposed on the second cover plate 20. The supporting structure 50 is arranged on the second cover plate 20 in an array. When the first cover plate 10 and the second cover plate 20 are connected in the sealed manner to form the sealed cavity 40, the supporting structure 50 has a supporting protection effect in the sealed cavity 40, so as to prevent the sealed cavity 40 of the vapor chamber 100 from squeezing deformation.

To ensure that the supporting structure 50 can have a good supporting and shape fixing effect, the supporting structure 50 abuts against the first cover plate 10 and/or the second cover plate 20. In some embodiments, a height of the supporting structure 50 is equal to a height of the sealed cavity 40. In addition, the supporting structure 50 arranged in an array facilitates light weight design of the vapor chamber, facilitates uniform distribution of mass of the vapor chamber, and facilitates design control over a gravity center of the entire electronic device.

The supporting structure 50 may be directly machined and prepared on the first cover plate or the second cover plate. That is, the supporting structure 50 and the housing no are an integrated structure, and the supporting structure 50 is a plurality of protruding columns or protruding points arranged in an array. Specifically, for the first cover plate 10 and the second cover plate 20 prepared through etching, the second material layer 12 of the first cover plate 10 is over-etched for surface reduction to form a recessed surface, and the second material layer 12 of the second cover plate 20 is etched for surface reduction to form the protruding columns arranged in an array, where the protruding columns are the supporting structure 50. The supporting structure 50 machined through an etching process for reduction can greatly ensure connection stability of the supporting structure 50 and the second cover plate 20, so as to prevent a bonding or welding process in between and simplify a machining process. It may be understood that, in this embodiment, a material of the supporting structure 50 is copper or copper alloy, and with the high-strength housing in cooperation, strength of the entire vapor chamber can also be ensured.

Figure 14A:
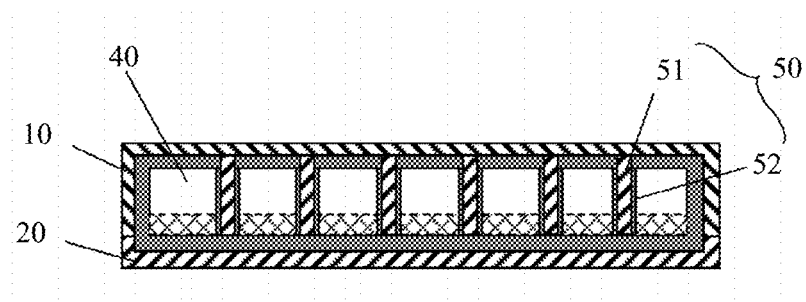
FIG. 14a is a schematic structural diagram of another vapor chamber according to an embodiment of this application.
Figure 14B:
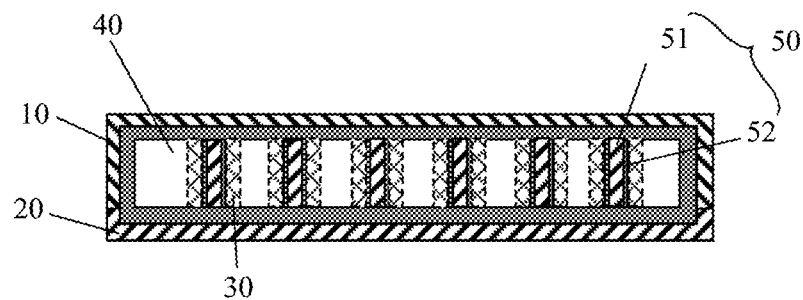
FIG. 14b is a schematic structural diagram of another vapor chamber according to an embodiment of this application.

FIG. 14*a* and FIG. 14*b* each are a schematic structural diagram of another vapor chamber according to an embodiment of this application. As shown in FIG. 14*a*, a material of the supporting structure 50 is a high-strength composite material, a material of an inner core 51 of the supporting structure 50 is the material of the first material layer, and a material of a periphery 52 of the supporting structure 50 is the material of the second material layer.

The supporting structure 50 may alternatively be prepared separately and then fixedly connected to the first cover plate or the second cover plate through welding or the like. Specifically, for the second cover plate 20 machined through stamping, a plate material of the second cover plate 20 is stamped for molding first and then reversely stretched to form a recessed region, and finally the supporting structure 50 and the second cover plate 20 are fixed through welding to form the supporting structure 50 uniformly arranged in an array, where the material of the periphery of the supporting structure and the material of the second material layer of the second cover plate each are copper or copper alloy. The inner core of the supporting structure is made of at least one material of stainless steel, titanium, titanium alloy, tungsten, tungsten alloy, chromium, or chromium alloy. The periphery of the supporting structure is made of copper or copper alloy. The periphery of the supporting structure can effectively separate the cooling medium from the first material layer, so as to eliminate a compatibility problem and prevent non-condensable gas from being generated.

It may be understood that the high-strength supporting structure 50 improves strength of the entire vapor chamber, so as to prevent the sealed cavity of the vapor chamber 100 from squeezing deformation.

Further, between the first cover plate 10 and the second cover plate 20, in a vertical direction, when the vapor channel and the capillary structure are in series, as shown in FIG. 1, FIG. 4 to FIG. 13, FIG. 14*a*, FIG. 19*b*, and FIG. 20*b*, the vapor chamber is a serial-structure vapor chamber; and when the vapor channel and the capillary structure are in parallel, as shown in FIG. 14*b*, FIG. 15*a* to FIG. 15*c*, FIG. 16, FIG. 17, FIG. 19*a*, and FIG. 20*a*, the vapor chamber is a parallel-structure vapor chamber.

For the serial-structure vapor chamber as shown in FIG. 14*a*, the capillary structure 30 is flat laid on the second cover plate 20, and the capillary structure 30 is located at a bottom of each vapor channel. A material of the capillary structure 30 is copper or copper alloy.

For the parallel-structure vapor chamber as shown in FIG. 14*b*, the capillary structure 30 is disposed on a periphery or two sides of the supporting structure 50 in an encircling manner and functions like the second material layer. The capillary structure separates the supporting structure from the cooling medium, so as to eliminate or greatly relieve a compatibility problem. In this case, the capillary structure 30 is disposed parallel to the vapor channel.

In other embodiments, the capillary structure 30 may alternatively be disposed on any side wall in the housing no. This is not limited herein.

Figure 15A:
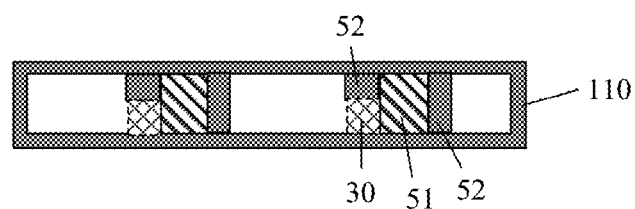
FIG. 15a is a schematic structural diagram of another vapor chamber according to an embodiment of this application.

FIG. 15*a* is a schematic structural diagram of another vapor chamber according to an embodiment of this application. As shown in FIG. 15*a*, a material of the supporting structure 50 is any one of stainless steel, titanium, titanium alloy, tungsten, tungsten alloy, chromium, or chromium alloy. The second material layer 12 and the capillary structure 30 are spliced and then disposed on a periphery of the supporting structure 50 in an encircling manner. Specifically, a material of the second material layer and a material of the capillary structure each are copper or copper alloy.

Figure 15B:
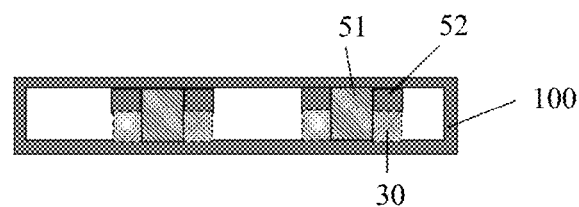
FIG. 15b is a schematic structural diagram of another vapor chamber according to an embodiment of this application.
Figure 15C:
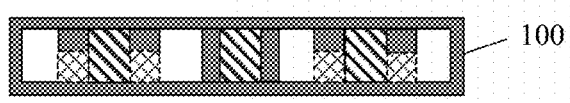
FIG. 15c is a schematic structural diagram of another vapor chamber according to an embodiment of this application.

Specifically, the second material layer 12 and the capillary structure 30 are spliced into a whole and then disposed on the periphery of the supporting structure 50 in the encircling manner, so as to separate the high-strength composite material from the cooling medium. As shown in FIG. 15*b* and FIG. 15*c*, the splicing manner may be partial splicing or half splicing. This is not limited herein.

Figure 16:
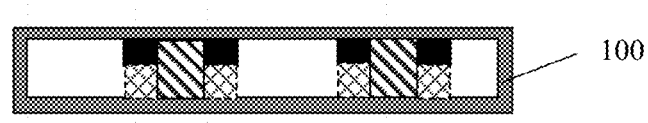
FIG. 16 is a schematic structural diagram of another vapor chamber according to an embodiment of this application.

Further, as shown in FIG. 16, other metal material and the capillary structure 30 may alternatively be spliced and then disposed on the periphery of the supporting structure 50 in an encircling manner, and the splicing manner is not limited herein. Specifically, other metal material may be, for example, any one of stainless steel, titanium, titanium alloy, tungsten, tungsten alloy, chromium, or chromium alloy. For example, the inner core of the supporting structure is made of stainless steel, the periphery made of titanium alloy and the capillary structure made of copper are spliced, or the periphery made of titanium and the capillary structure made of copper alloy are spliced. The splicing manner is not limited.

It may be understood that the supporting structure 50 may also be applied to the vapor chamber as illustrated in FIG. 4 to FIG. 12, and the supporting structure may be made of copper or copper alloy, or made of the high-strength composite material.

FIG. 17 is a schematic structural diagram of another vapor chamber according to an embodiment of this application. As shown in FIG. 17, the capillary structure 30 is disposed on the periphery of the supporting structure 50 in an encircling manner, where a material of the supporting structure 50 is any one of stainless steel, titanium, titanium alloy, tungsten, tungsten alloy, chromium, or chromium alloy, and a material of the capillary structure 30 is copper or copper alloy. The capillary structure 30 is disposed on the periphery of the supporting structure 50 in the encircling manner, and the vapor channel is disposed parallel to the capillary structure 30, so that the supporting structure 50 is separated from the cooling medium, thereby eliminating or greatly relieving a compatibility problem and preventing non-condensable gas that breaks a negative pressure environment from being generated by reaction of the cooling medium and the first material layer of the housing 110.

Specifically, the capillary structure 30 fully covers the periphery of the supporting structure 50. Based on a requirement for structural strength of the vapor chamber, the high-strength ultra-thin supporting structure 50 may be irregular in shape and different in cross section, for example, I-beam. As shown in FIG. 18, the supporting structure 50 is irregular cylinder-shaped.

Further, FIG. 19a and FIG. 19b each are a top view of another vapor chamber according to an embodiment of this application, and FIG. 20a and FIG. 20b each are a top view of another vapor chamber according to an embodiment of this application. As shown in FIG. 20a and FIG. 20b, the supporting structure 50 is disposed in the sealed cavity 40. A plurality of supporting structures 50 may be disposed continuously or discontinuously. In this embodiment, the supporting structure 50 is not limited in shape, for example, may be cylinder-shaped, cube-shaped, or cone-shaped. A plurality of supporting structures 50 may alternatively vary in shape. This is not limited herein.

The supporting structure 50 in FIG. 19a and FIG. 20a is made of a high-strength material, for example, at least one of stainless steel, titanium, titanium alloy, tungsten, tungsten alloy, chromium, or chromium alloy, resembling the first material layer 11. The capillary structure 30 encircles the supporting structure 50, and a material of the capillary structure 30 is copper or copper alloy, resembling the second material layer 12, so as to separate the supporting structure 50 made of the high-strength material from the cooling medium, greatly relieve a compatibility problem and prevent non-condensable gas from being generated. In this case, as shown in FIG. 19a, a common material such as copper may be selected; and as shown in FIG. 20a, the housing no may alternatively select a high-strength composite material.

The supporting structure 50 in FIG. 19b and FIG. 20b is made of a high-strength composite material, and the supporting structure 50 includes an inner core 51 and a periphery 52 encircling the inner core 51, where a material of the inner core 51 is the material of the first material layer 11, for example, stainless steel, titanium, titanium alloy, tungsten, tungsten alloy, chromium, or chromium alloy. A material of the periphery 52 is the material of the second material layer 12: copper or copper alloy. The capillary structure 30 is flat laid on the second material layer of the first cover plate 10 and/or the second cover plate 20, and a material of the capillary structure 30 is copper or copper alloy, so as to separate the supporting structure 50 made of the high-strength composite material from the cooling medium, greatly relieve a compatibility problem and prevent non-condensable gas from being generated.

In a specific embodiment, to ensure overall strength and light weight design of the vapor chamber 100, a thickness of the first cover plate 10 and a thickness of the second cover plate 20 each are less than or equal to 0.15 mm.

Figure 21A:
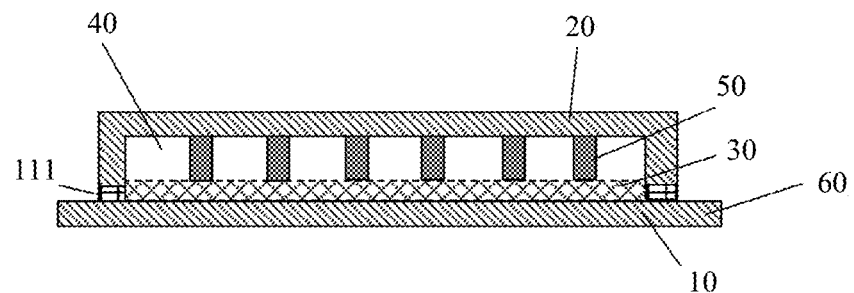
FIG. 21a is a schematic structural diagram of another vapor chamber according to an embodiment of this application.
Figure 21B:
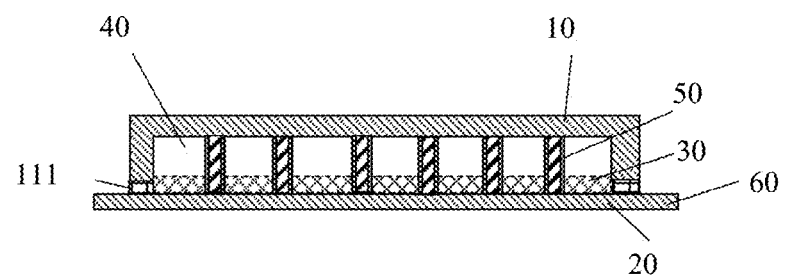
FIG. 21b is a schematic structural diagram of another vapor chamber according to an embodiment of this application.
Figure 21C:
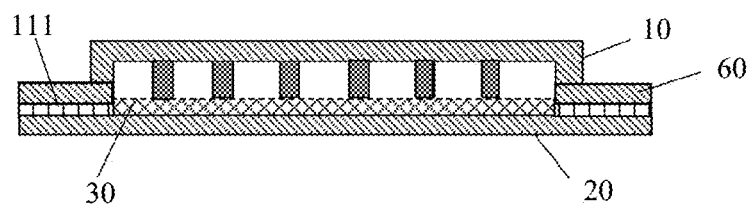
FIG. 21c is a schematic structural diagram of another vapor chamber according to an embodiment of this application.

FIG. 21a to FIG. 21c each are a schematic structural diagram of another vapor chamber according to an embodiment of this application. As shown in FIG. 21a to FIG. 21c, for ease of mounting and fixing the vapor chamber, the vapor chamber 100 further includes a step fixing part 60 formed by extending along at least a part of an edge of the vapor chamber 100, where the step fixing part 60 is configured to mount and fix the vapor chamber 100.

As shown in FIG. 21a, the step fixing part 60 may be an edge of the first cover plate 10, and a vertical projected area of the first cover plate 10 is greater than a vertical projected area of the second cover plate 20. As shown in FIG. 21b, the step fixing part 60 may alternatively be an edge of the second cover plate 20, and a vertical projected area of the second cover plate 20 is greater than a vertical projected area of the first cover plate 10. As shown in FIG. 21c, the step fixing part 60 may still alternatively be an integrated edge of the first cover plate 10 and the second cover plate 20 that is formed through connection. In this embodiment, a vertical projected area of the second cover plate 20 is the same as a vertical projected area of the first cover plate 10.

It may be understood that the step fixing part 60 may be directly welded or bonded to a to-be-mounted object, and the step fixing part 60 formed by extending the first cover plate 10 and/or the second cover plate 20 can improve mounting structural stability of the vapor chamber and can also reduce the thickness of the vapor chamber and prevent an additional fixing structure from being added. The to-be-mounted object may be, for example, a middle frame of the electronic device.

FIG. 22a to FIG. 22c each are a schematic structural diagram of a step fixing part of a vapor chamber according to an embodiment of this application. As shown in FIG. 22a to FIG. 22c, holes 601 and/or slots 602 are provided in the step fixing part 60, so that fixing structures such as rivets, screws, or bolts pass through the holes 601 and/or the slots 602 to fix the vapor chamber 100 to the middle frame. Specifically, the holes 601 and/or the slots 602 may be arranged at equal intervals along the step fixing part 60, or may be arranged at unequal intervals. In this embodiment, the holes 601 and the slots 602 are not limited in shape, and may be circular, elliptical, square, fan-shaped, or the like.

Further, as shown in FIG. 23a to FIG. 23d, for ease of mounting an electronic component, the vapor chamber 100 is provided with a mounting recess 71 and/or a mounting hole 72 in a thickness direction, where the mounting recess 71 and/or the mounting hole 72 are/is configured to mount the electronic component, and the electronic component may be, for example, a flexible printed circuit, a fingerprint module, or a screen module.

Figures 23C, 23D:
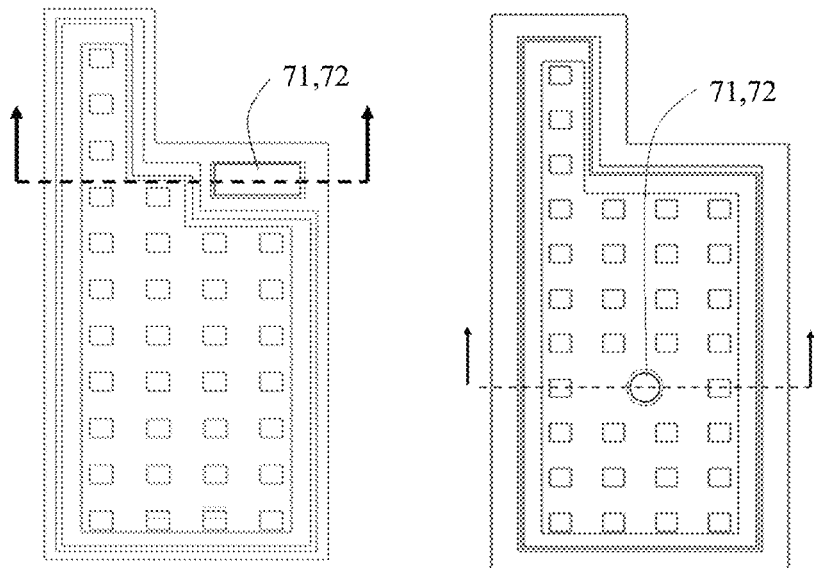

As shown in FIG. 23a, the mounting recess 71 or the mounting hole 72 is provided in an edge of the vapor chamber 100, and the capillary structure 30 is disposed on a part of an edge of the mounting recess 71 or the mounting hole 72 in an encircling manner, that is, the mounting recess 71 or the mounting hole 72 adjoins the capillary structure 30 of the vapor chamber 100. As shown in FIG. 23b, the capillary structure 30 is disposed on a periphery of the mounting recess 71 or the mounting hole 72 in a full encircling manner. As shown in FIG. 23c, the mounting recess 71 or the mounting hole 72 may alternatively be provided in the step fixing part 60 of the vapor chamber 100. As shown in FIG. 23d, the capillary structure 30 may be absent from the periphery of the mounting recess 71 or the mounting hole 72. It may be understood that, compared with a recess region without the capillary structure 30, a region with the capillary structure 30 has a higher heat conduction coefficient and a better cooling effect.

Figure 24A:
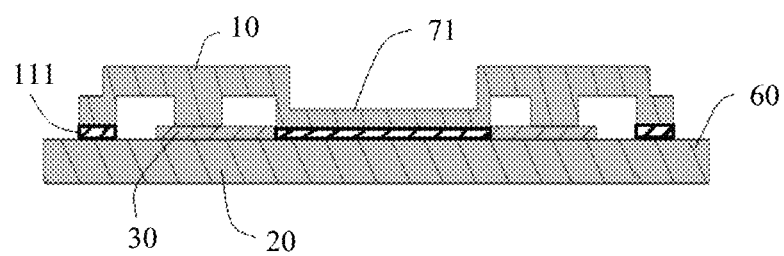
FIG. 24a to FIG. 24e each are a sectional schematic structural diagram of a vapor chamber according to an embodiment of this application.
Figure 24B:
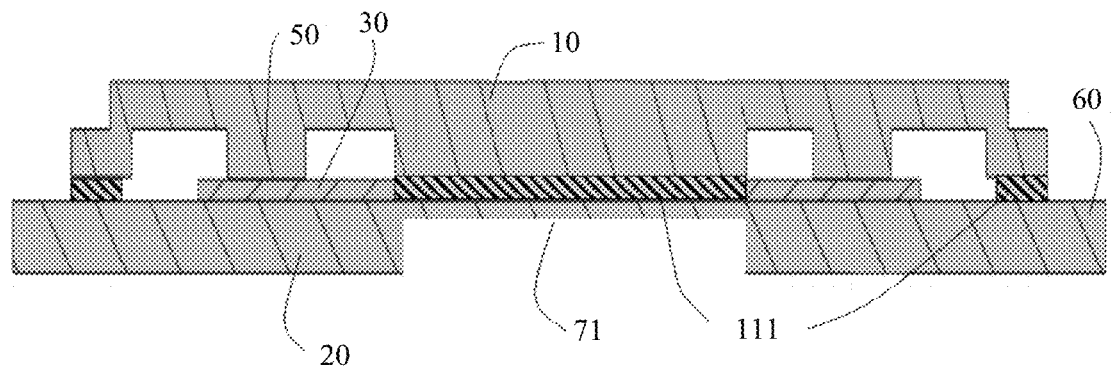

As shown in FIG. 24a and FIG. 24b, in an implementation, the mounting recess 71 is formed in the first cover plate 10 or the second cover plate 20 the vapor chamber 100 in a thickness direction, that is, a depth of the mounting recess 71 is less than a thickness of the first cover plate 10 or a thickness of the second cover plate 20. The mounting recess 71 may be square, circular, elliptical, or other irregular shaped, and may be formed through a process such as etching or partial stamping.

Figure 24C:
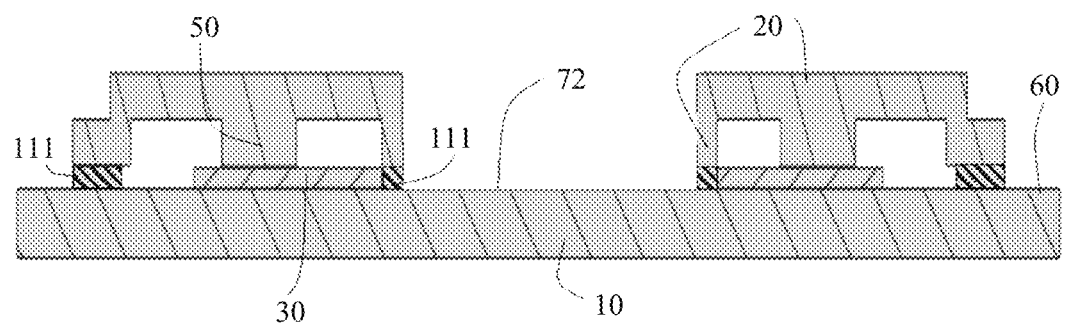
Figure 24D:
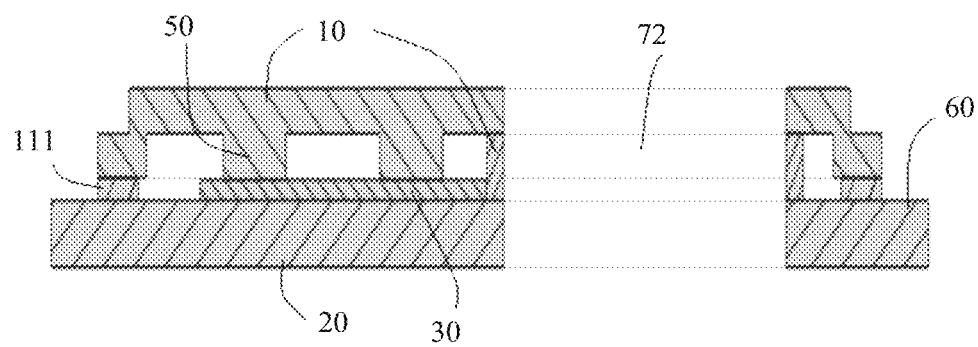
Figure 24E:
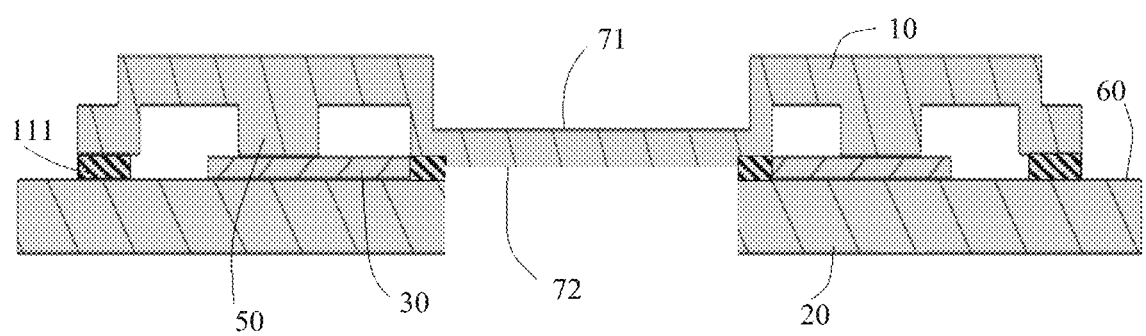

In another implementation, the mounting hole 72 runs through the first cover plate 10 and/or the second cover plate 20. As shown in FIG. 24*c*, the mounting hole 72 runs through the second cover plate 20; and as shown in FIG. 24*d*, the mounting hole 72 runs through the first cover plate 10 and the second cover plate 20, that is, the mounting hole 72 runs through the entire vapor chamber 100. As shown in FIG. 24*e*, the mounting hole 72 that runs through the second cover plate 20 and the mounting recess 71 that is formed in the first cover plate 10 through recessing are located on two sides of the vapor chamber 100 respectively. It should be noted that the sealed cavity of the vapor chamber 100 is not affected by the mounting recess 71 and/or the mounting hole 72 provided in the vapor chamber 100, and the sealed cavity may keep a negative pressure state through partial welding (such as tin soldering) and bonding.

Further, the vapor chamber 100 includes a first section 101, a second section 102, and a bent section 103 connected to the first section 101 and the second section 102, where the first section 101 and the second section 102 have a height difference, and the capillary structure 30 keeps a continuous state in the first section 101, the second section 102, and the bent section 103.

Figure 25:
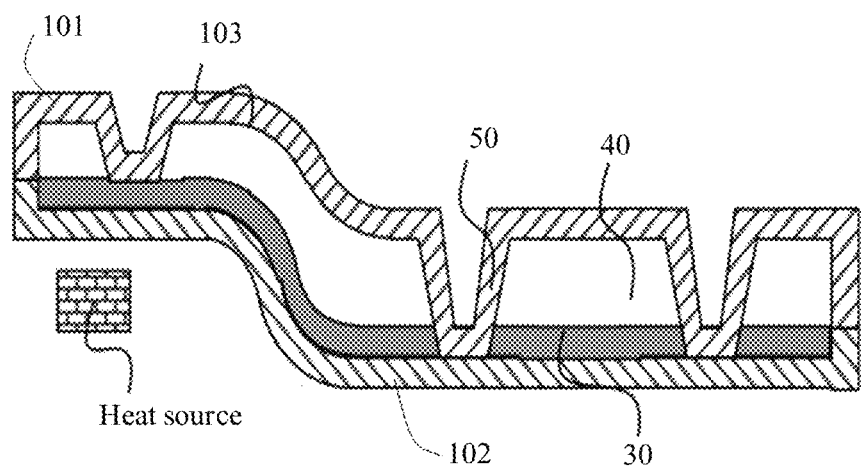
FIG. 25 is a sectional schematic structural diagram of another vapor chamber according to an embodiment of this application.

As shown in FIG. 25, a part of the sealed cavity in the first section 101 and part of the sealed cavity in the second section 102 are different in height, that is, the entire vapor chamber 100 is a vapor chamber with different thicknesses, and an overall thickness of the first section 101 may be less than or greater than an overall thickness of the second section 102. The supporting structure 50 is disposed in the first section 101 and the second section 102, and a specific form of the supporting structure 50 is not limited herein. It may be understood that the bent vapor chamber can be adapted to a small mounting space, so as to meet a partial cooling requirement of the electronic component; and moreover, increasing a height of a sealed chamber appropriately to enlarge the vapor channel in the vapor chamber facilitates two-phase heat exchange of the cooling medium and may improve cooling efficiency.

In other embodiments, the vapor chamber 100 may further include a third section and a second bent section connected to the third section and the second section, so that the vapor chamber 100 has a plurality of bent sections. It should be noted that because the vapor chamber provided in the embodiments of this application is made of the high-strength composite material, strength of the entire vapor chamber can still meet use requirements after bending treatment.

Second Aspect

An embodiment of this application further provides a preparation method of a vapor chamber. The method includes:
  disposing a second material layer on a side of a first material layer to form a first cover plate;
  disposing a second material layer on a side of a first material layer to form a second cover plate, where a material of the first material layer is at least one of stainless steel, titanium, titanium alloy, tungsten, tungsten alloy, chromium, and chromium alloy, and a material of the second material layer is copper or copper alloy;
  disposing a supporting structure on an inner surface of a housing to extend towards an internal space of the housing, where a material of an inner core of the supporting structure is the material of the first material layer, and a material of a periphery of the supporting structure is the material of the second material layer; and
  disposing the capillary structure on the second material layer of the first cover plate or the second material layer of the second cover plate, combining the first cover plate and the second cover plate to form the hollow housing, and injecting the cooling medium into the housing, where the second material layer is located on an inner side of the housing to separate the first material layer from the cooling medium, and
  implementing heat cycling of the cooling medium in the housing by using the capillary structure and a vapor channel.

It may be understood that because the second material layer is located on the inner side of the housing no, the high-strength metal material (such as stainless steel, titanium, titanium alloy, tungsten, tungsten alloy, chromium, or chromium alloy) is used to reinforce copper, so as to improve strength and deformation-resistant capability of the vapor chamber. In addition, as copper is selected for the inner layer, the first material layer 11 can be separated from a working medium such as water, so as to greatly mitigate or eliminate a compatibility problem.

The capillary structure is generally a copper-based porous medium, for example, copper mesh, copper powder, and foamy copper, and may be generated by using a method such as copper mesh knitting, wire drawing, etching, electroplating, chemical depositing, or the like. The cooling medium may be, for example, water, deionized water, methanol, or acetone.

The first cover plate or the second cover plate may alternatively form a supporting structure through etching, stamping, or the like, so as to further improve deformation-resistant capability of the vapor chamber.

Embodiment 1

In this embodiment, a high-strength composite material is selected to form a first cover plate and a second cover plate through stamping, and the high-strength composite material includes a first material layer made of stainless steel and a second material layer made of copper.

A capillary structure is disposed between the first cover plate and the second cover plate, the first cover plate and the second cover plate are laser welded to form a housing with a sealed cavity, and the second material layer is located on an inner side of the housing. In this embodiment, the capillary structure is made of copper powder. A thickness of the first cover plate and a thickness of the second cover plate each are 0.15 mm. Provided that test force of 300 gf is applied to the vapor chamber for 10 s, a surface hardness of the vapor chamber ranges from 180 HV to 400 HV.

Embodiment 2

In this embodiment, a high-strength composite material is selected to form a first cover plate and a second cover plate through stamping, and the high-strength composite material includes a first material layer made of titanium and a second material layer made of copper.

A capillary structure is disposed between the first cover plate and the second cover plate, the first cover plate and the second cover plate are laser welded to form a housing with a sealed cavity, and the second material layer is located on an inner side of the housing. In this embodiment, the capillary structure is made of copper powder. A thickness of the first cover plate and a thickness of the second cover plate each are 0.15 mm. Provided that test force of 300 gf is applied to the vapor chamber for 10 s, a surface hardness of the vapor chamber ranges from 180 HV to 400 HV.

Embodiment 3

In this embodiment, a high-strength composite material is selected to form a first cover plate and a second cover plate through stamping, and the high-strength composite material includes a first material layer made of titanium alloy and a second material layer made of copper.

A capillary structure is disposed between the first cover plate and the second cover plate, the first cover plate and the second cover plate are laser welded to form a housing with a sealed cavity, and the second material layer is located on an inner side of the housing. In this embodiment, the capillary structure is made of copper powder. A thickness of the first cover plate and a thickness of the second cover plate each are 0.15 mm. Provided that test force of 300 gf is applied to the vapor chamber for 10 s, a surface hardness of the vapor chamber ranges from 180 HV to 400 HV.

Comparative Example 1

In Comparative Example 1, copper is selected to form a first cover plate and a second cover plate through stamping, a capillary structure is disposed between the first cover plate and the second cover plate, the first cover plate and the second cover plate are laser welded to form a housing with a sealed cavity. The capillary structure is made of copper powder. A thickness of the first cover plate and a thickness of the second cover plate each are 0.15 mm. Provided that test force of 300 gf is applied to the vapor chamber for 10 s, a surface hardness of the vapor chamber ranges from 80 HV to 120 HV.

It may be learned from the experimental data in Embodiments 1 to 3 and Comparative Example 1 that, a surface hardness in Embodiments 1 to 3 is increased by more than 50% compared with a surface hardness in Comparative Example 1.

Embodiment 4

In this embodiment, a high-strength composite material is selected to form a first cover plate and a second cover plate through stamping, and the high-strength composite material includes a first material layer made of stainless steel and a second material layer made of copper. A supporting structure uniformly arranged in an array is welded to the second cover plate, where a material of an inner core of the supporting structure is stainless steel, and a material of a periphery of the supporting structure is copper.

A capillary structure is disposed between the first cover plate and the second cover plate, the first cover plate and the second cover plate are laser welded to form a housing with a sealed cavity, and the second material layer is located on an inner side of the housing. The capillary structure is made of copper powder. A thickness of the first cover plate and a thickness of the second cover plate each are 0.15 mm. Provided that test force of 300 gf is applied to the vapor chamber for 10 s, a surface hardness of the vapor chamber ranges from 180 HV to 400 HV.

Embodiment 5

In this embodiment, a high-strength composite material is selected to form a first cover plate and a second cover plate through stamping, and the high-strength composite material includes a first material layer made of titanium and a second material layer made of copper. A supporting structure uniformly arranged in an array is welded to the second cover plate, where a material of an inner core of the supporting structure is titanium, and a material of a periphery of the supporting structure is copper.

A capillary structure is disposed between the first cover plate and the second cover plate, the first cover plate and the second cover plate are laser welded to form a housing with a sealed cavity, and the second material layer is located on an inner side of the housing. The capillary structure is made of copper powder. A thickness of the first cover plate and a thickness of the second cover plate each are 0.15 mm. Provided that test force of 300 gf is applied to the vapor chamber for 10 s, a surface hardness of the vapor chamber ranges from 180 HV to 400 HV.

Embodiment 6

In this embodiment, a high-strength composite material is selected to form a first cover plate and a second cover plate through stamping, and the high-strength composite material includes a first material layer made of titanium alloy and a second material layer made of copper. A supporting structure uniformly arranged in an array is welded to the second cover plate, where a material of an inner core of the supporting structure is titanium alloy, and a material of a periphery of the supporting structure is copper.

A capillary structure is disposed between the first cover plate and the second cover plate, the first cover plate and the second cover plate are laser welded to form a housing with a sealed cavity, and the second material layer is located on an inner side of the housing. The capillary structure is made of copper powder. A thickness of the first cover plate and a thickness of the second cover plate each are 0.15 mm. Provided that test force of 300 gf is applied to the vapor chamber for 10 s, a surface hardness of the vapor chamber ranges from 180 HV to 400 HV.

Comparative Example 2

In this embodiment, copper is selected to form a first cover plate and a second cover plate through stamping, where a supporting structure uniformly arranged in an array is welded to the second cover plate, and a material of the supporting structure is copper.

A capillary structure is disposed between the first cover plate and the second cover plate, the first cover plate and the second cover plate are laser welded to form a housing with a sealed cavity. The capillary structure is made of copper powder. A thickness of the first cover plate and a thickness of the second cover plate each are 0.15 mm. Provided that test force of 300 gf is applied to the vapor chamber for 10 s, a surface hardness of the vapor chamber ranges from 80 HV to 120 HV.

It may be learned from the experimental data in Embodiments 4 to 6 and Comparative Example 2 that, a surface hardness in Embodiments 4 to 6 is increased by more than 50% compared with a surface hardness in Comparative Example 2.

Third Aspect

This embodiment further provides an electronic device, including a working module, where a cooling module includes the vapor chamber according to the first aspect, and the vapor chamber is configured to cool the working module. The electronic device may be, for example, a mobile phone, a tablet computer, or a wearable device (such as a smart watch). This is not limited herein.

Figure 26A:
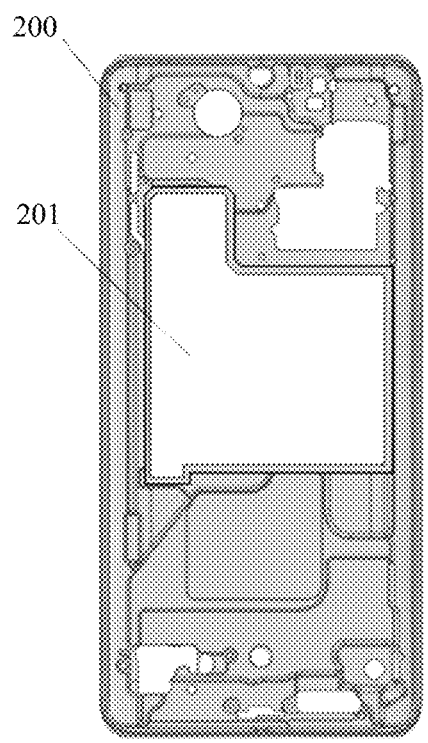
FIG. 26a is a schematic structural diagram of a middle frame of an electronic device according to an embodiment of this application.
Figure 26B:
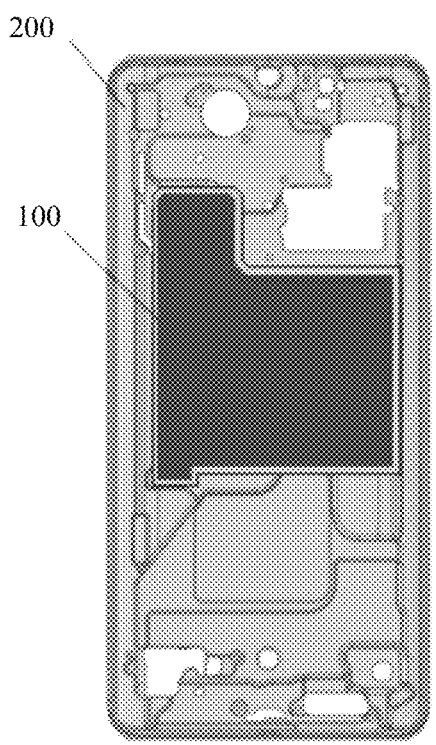
FIG. 26b is a schematic structural diagram illustrating mounting of a middle frame of an electronic device and a vapor chamber according to an embodiment of this application.
Figure 26C:
FIG. 26c is a cross-sectional view of a middle frame of an electronic device according to an embodiment of this application.

FIG. 26a is a schematic structural diagram of a middle frame of an electronic device according to an embodiment of this application. FIG. 26b is a schematic structural diagram illustrating mounting of a middle frame of an electronic device and a vapor chamber according to an embodiment of this application. FIG. 26c is a cross-sectional view of a middle frame of an electronic device according to an embodiment of this application. The electronic device further includes a middle frame 200 and a display screen, where a through-hole 201 is provided in the middle frame, the vapor chamber 100 is embedded in the through-hole 201, and the vapor chamber 100 and the middle frame 200 jointly bear the display screen.

To improve cooling capability of a mobile terminal, the large area vapor chamber becomes a trend in technological development. Limited by space of the mobile terminal, the ultra-thin vapor chamber with a thickness less than or equal to 0.8 mm is generally provided, and a wall thickness of a cover plate of the vapor chamber is less than or equal to 0.2 mm. A conventional material is copper and copper alloy, and an ultra-thin large area and large span vapor chamber module is prone to surface flatness problems such as pits and creases and greatly deteriorates compared with a conventional small area vapor chamber, causing large decrease of yield of the vapor chamber module and large increase of costs. Due to falling in later production, assembly, transportation and daily use by users, relatively soft copper is prone to unrecoverable plastic deformation, and especially with high temperature processing such as welding and sintering on copper alloy, a surface hardness of the vapor chamber is less than or equal to 90 Hv and does not meet production and reliability design requirements. The large area vapor chamber is limited by bearing structural strength of the vapor chamber during application, for example, located between a screen display module and a battery module. Because mechanical indicators (especially elasticity modulus and surface hardness) of stainless steel, titanium, and titanium alloy are far greater than those of common copper or copper alloy material in an existing industry, problems such as pits, creases, and prone plastic deformation under force may be effectively mitigated.

During application of the mobile terminal, the higher the area of the vapor chamber is, the stronger the overall cooling capability is. In an ideal state, when the entire middle frame of the mobile terminal is the vapor chamber, the entire device reaches or approaches a natural cooling limit, to support cooling requirements in working conditions such as high performance gaming, photographing, and ultra-high power charging.

In some implementations, the vapor chamber and the middle frame may be of a serial stack structure, and the entire device is, however, thickened obviously. Moreover, the large area vapor chamber that hardly functions to meet evaporation and condensation requirements and that does not effectively improve cooling capability does not meet a product competitiveness requirement.

To reduce the thickness of the entire device, a hole may be provided in part or all of the middle frame, and the vapor chamber is disposed in the hole. For a conventional copper or copper alloy vapor chamber, the middle frame with a large battery compartment area hollowed out is provided with strength only by a middle frame side, causing a great decline of strength, and especially for a 3D screen modeling and a widened 5G antenna gap, the side is thinned, continuity of the middle frame side is broken, and three-rod bending strength does not reach the standard and is difficult to optimize or reinforce. Moreover, the large area vapor chamber is in a cantilever beam state in the middle frame, and the vapor chamber is prone to deformation and relatively poor in flatness after being welded, bringing a risk of falling crush to a screen of the electronic device.

Figure 26D:
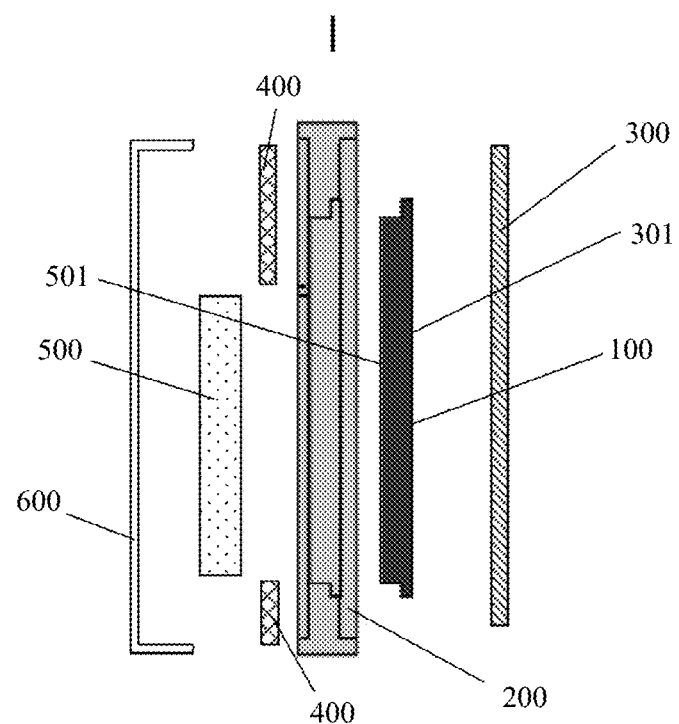
FIG. 26d to FIG. 26g each are an exploded view of a mobile terminal according to an embodiment of this application.
Figure 26E:
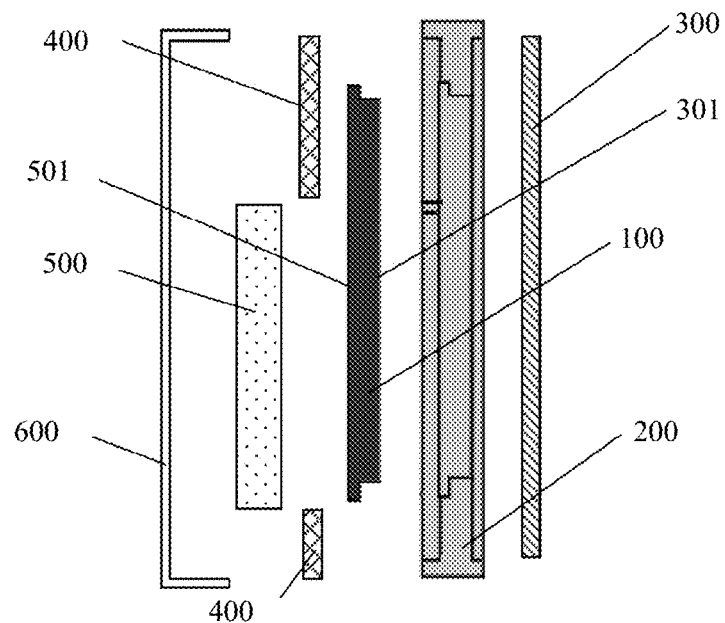

FIG. 26d and FIG. 26e each are an assembly schematic exploded view of a mobile terminal according to an embodiment of this application. As shown in FIG. 26d and FIG. 26e, to improve cooling capability of the mobile terminal, this embodiment further provides a mobile terminal, including a middle frame 200, a display screen 300, a vapor chamber 100, one or more circuit boards 400, a battery 500, a rear housing 600, and the like. The mobile terminal may be provided with two or more batteries, circuit boards, and the like. The middle frame 200 as a structural member has a supporting function. A through-hole 201 is provided in the middle frame 200, the vapor chamber 100 is embedded in the through-hole 201, and the vapor chamber 100 and the middle frame 200 are fixedly connected into a whole and configured to jointly bear the display screen 300, the circuit board 400, the battery 500, and the like. The mobile terminal may be a mobile phone, a tablet computer, a curved screen mobile phone, a folding mobile phone, or the like. This is not limited herein.

Specifically, an area of the through-hole 201 of the middle frame 200 accounts for more than ⅓ of a total area of the middle frame, or an area of the through-hole 201 is more than 70% of an area of the battery 500. Certainly, the size and shape of the through-hole 201 may also be adjusted based on actual needs. This is not limited herein. It should be noted that the through-hole 201 is provided in part or all of the middle frame, causing a decline of structural strength of the middle frame, the vapor chamber 100 is disposed in the through-hole 201, and the vapor chamber 100 cooperates with the middle frame to support the display screen 300, the circuit board 400, the battery 500, or other components required by other mobile terminals, so that overall structural stability of the mobile terminal can be improved.

Figure 26F:
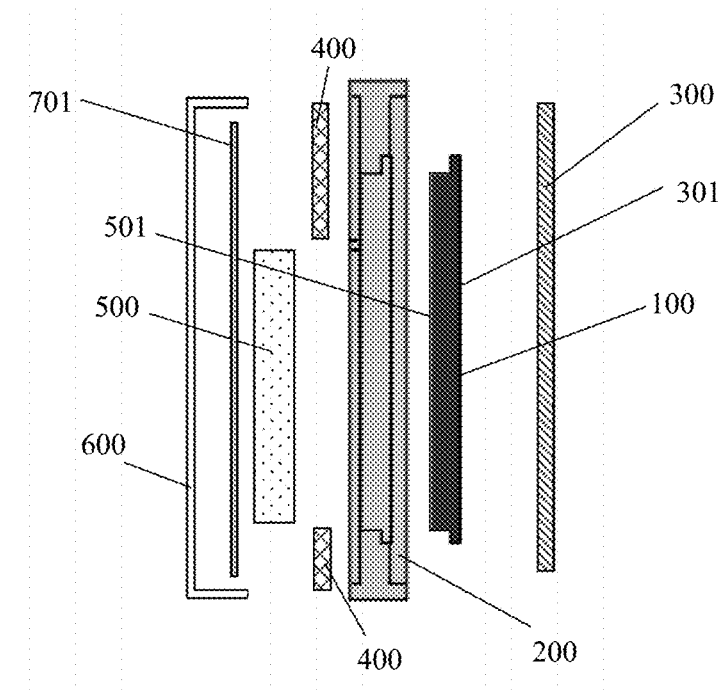
Figure 26G:
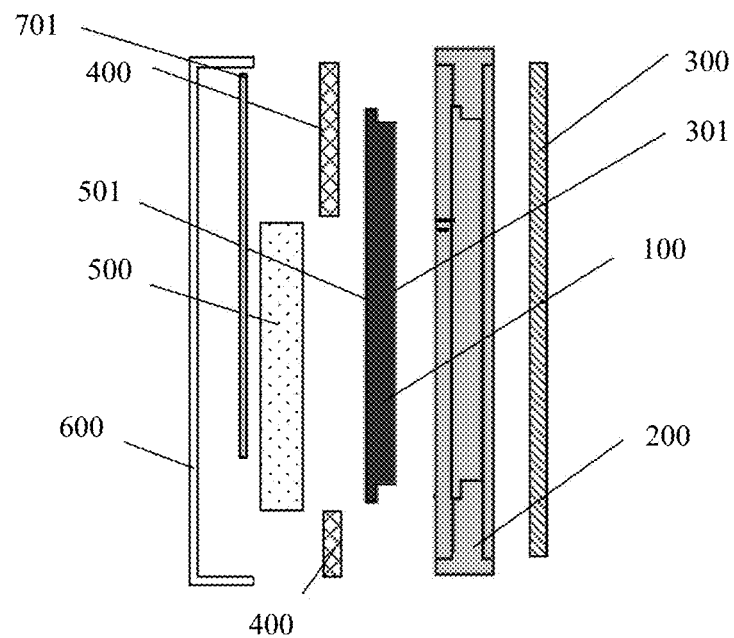

As shown in FIG. 26f to FIG. 26g, to further improve cooling performance, a PCB 400 that carries a heating device is sandwiched between the vapor chamber 100 and a cooling material 701 such as a high thermal conductivity graphene film/extremely-thin vapor chamber to form sandwich cooling, so that stronger natural cooling capability under a same thickness can be implemented. The heating device mainly refers to a central processing unit (central processing unit, CPU), a graphics processing unit (Graphics Processing Unit, GPU), an application processor (Application Processor, AP), or other main heating devices.

Specifically, the mobile terminal further includes a cooling layer 701 and a heating device, where the cooling layer 701 is disposed on an inner side of the rear housing 600. As shown in FIG. 26f to FIG. 26g, the heating device is sandwiched between the vapor chamber 100 and the cooling layer 701 to form a sandwich cooling structure, so as to implement stronger natural cooling capability. In some embodiments, a material of the cooling layer 701 may be a non-bearing material such as high thermal conductivity graphene or extremely-thin vapor chamber. It may be understood that, in an actual application process, the middle frame 200 and the vapor chamber 100 still serve as a load-bearing supporting member, and the sandwich cooling structure is also applied, so that stronger natural cooling capability under a same thickness can be implemented.

Specifically, a connection manner of the vapor chamber 100 and the middle frame 200 includes any one or more of riveting, bonding, welding, lapping, and metal over-molding.

Two side surfaces are provided on the vapor chamber 100, including a battery surface 501 facing towards the battery 500 and a display surface 301 facing towards the display screen 300, where the display screen 300 and the battery 500 are disposed on two sides of the vapor chamber 100 in parallel respectively, and the display screen 300 and the display surface 301 are parallel without contact. Optionally, the battery 500 and the battery surface 501 are parallel without contact, or the battery 500 is fixed to the battery surface 501 through back glue bonding or the like. This is not limited herein.

Material such as graphite film, foam, glue, or flexible printed circuit (Flexible Printed Circuit, FPC) may be attached to surfaces of a display screen 300 module, a vapor chamber 100 module, and a battery 500 module. The vapor chamber 100 is located between the sensitive display screen 300 module and the battery 500 module.

The vapor chamber of special structural design meets reliability and safety design requirements of the display screen, the battery and electrical connection structures of the mobile terminal, so as to implement cooling design that the ultra-thin vapor chamber fully covers the key heating device.

The circuit board 400 may be fixed to a side of the middle frame 200 away from the display screen 300 by using a screw or a plastic buckle. The middle frame 200 protects and bears the circuit board 400. Heat generated by the circuit board 400 may be conducted to the vapor chamber 100. The rear housing 600 is located on a side of the battery 500 away from the middle frame 200.

The mobile terminal may alternatively be a folding mobile phone. When the folding mobile phone is in a folding or bent state, the display screen 300 and the battery 500 are disposed on two sides of the vapor chamber 100 in parallel respectively, and the display screen 300 and the display surface 301 are parallel without contact. Optionally, the battery 500 and the battery surface 501 are parallel without contact, or the battery 500 is fixed to the battery surface 501 through back glue bonding or the like. This is not limited herein. Here, "parallel" may indicate that an upper surface and a lower surface are equidistantly parallel in a bent state.

It may be understood that the display screen and the battery are on the two sides of the vapor chamber in parallel respectively and the display screen is not in direct contact with the vapor chamber, so that the display screen can be prevented from adverse effects caused by localized deformation of the vapor chamber, and stability of the entire mobile terminal is kept.

In this embodiment, the vapor chamber 100 can directly bear a part of a supporting function of the middle frame. When the circuit board 400 starts to work, heat generated by the circuit board 400 may be conducted to the vapor chamber 100.

It may be understood that, in this implementation, the middle frame 200 that is provided with the through-hole 201 and the vapor chamber 100 that is embedded in the middle frame 200 are arranged as a parallel structure. In contrast, a serial structure is that the middle frame 200 is not provided with a through-hole that is corresponding to the vapor chamber and the vapor chamber 100 is attached to the entity middle frame 200. Even with recessing and partial embedding, the serial structure is still thicker than the parallel structure, meaning that ultra-thin design of the mobile terminal is unachievable. However, because the serial structure has a low requirement for strength of the vapor chamber, a conventional vapor chamber may be applied. Because the high-strength vapor chamber directly bears a part of the supporting function of the middle frame, the vapor chamber for the parallel structure has various performance far better than an ordinary copper alloy vapor chamber in a serial structure middle frame assembly, so that strength, surface hardness, and reliability of the vapor chamber can be improved, thereby improving stability and reliability of the entire middle frame. If the strength of the vapor chamber 100 is insufficient, the vapor chamber 100 deforms and warps under external force after long-term use and is in contact with the display screen 300. This breaks a parallel relationship of the display surface 301 and the display screen 300, thereby affecting a display effect and causing blue spots, white spots, and the like. In addition, the vapor chamber 100 may also be easily in contact with the battery 500. This breaks a parallel relationship of the battery surface 501 and the battery 500, thereby causing a vicious battery safety accident. Therefore, with such strong cooling ultra-thin design, the vapor chamber 100 made of the high-strength composite material can improve use stability of the entire mobile terminal.

Figure 27:
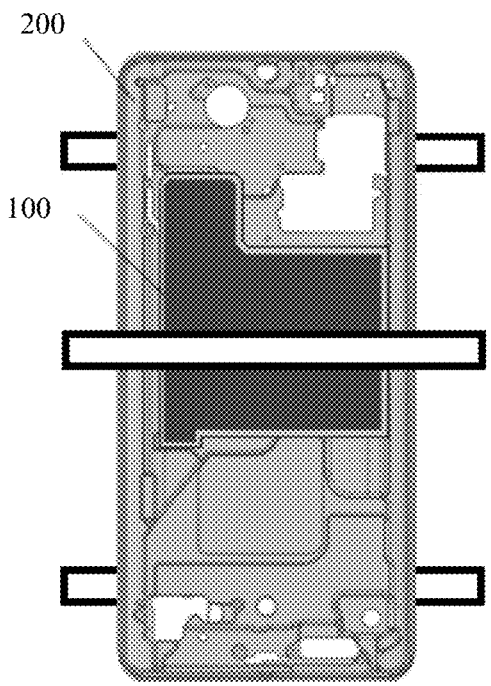
FIG. 27 is a schematic diagram illustrating strength test of a middle frame of a mobile terminal according to an embodiment of this application.

FIG. 27 is a schematic diagram illustrating strength test of a middle frame according to an embodiment of this application. As shown in FIG. 27, in contrast to an ordinary copper alloy vapor chamber that cooperates with the middle frame 200 to serve as a structural supporting member and that has three-rod bending strength only ranging from 80 N/mm to 90 N/mm, the vapor chamber 100 in this application that cooperates with the middle frame 200 to serve as a structural supporting member and that has three-rod bending strength ranging from 100 N/mm to 120 N/mm can be configured to bear the display screen and the battery.

To keep a good cooling effect, an area of the evaporation region of the vapor chamber 100 that is in contact with the heat source is smaller than an area of the condensation region that is in contact with a comparatively cold region, so that the capillary structure 30 is densely arranged in the small area evaporation region and comparatively sparsely arranged in the large area condensation region. It should be noted that the evaporation region of the vapor chamber 100 abuts against the heating device of the mobile terminal (for example, circuit board 400, CPU, GPU, or AP), and the condensation region of the vapor chamber 100 may abut against the battery 500 of the mobile terminal. When heat of the heating device is conducted to the evaporation region, the cooling medium in the evaporation region is evaporated into vapor, the vapor flows through the vapor channel in the vapor chamber towards the condensation region, and the condensed cooling medium flows back into the evaporation region under the action of the capillary structure in the vapor chamber. In this embodiment, the capillary structure 30 radiates to the condensation region from the evaporation region in contact with the heat source, so as to ensure that the cooling medium in the condensation region can flow back to the evaporation region.

Figure 28D:
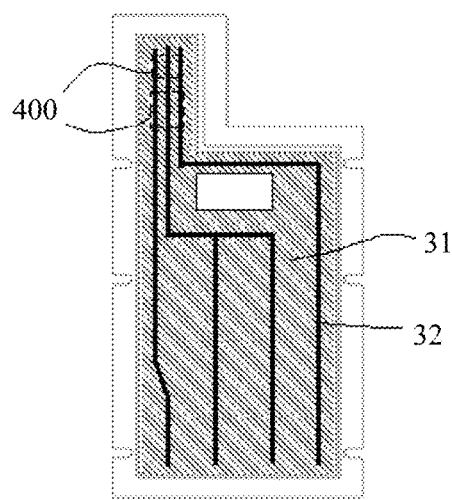
Figure 28E:
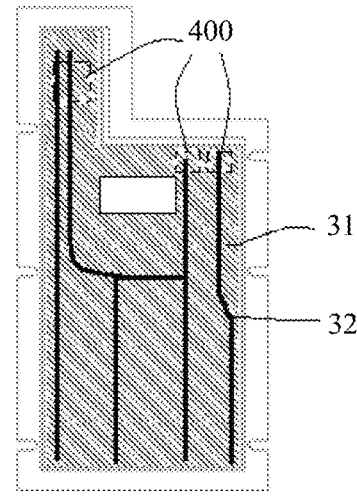

For ease of mounting an electronic component, as shown in FIG. 28a, the vapor chamber 100 is provided with a mounting recess 71 and/or a mounting hole 72 in a thickness direction, where the mounting recess 71 and/or the mounting hole 72 are/is configured to mount the electronic component, and the electronic component may be, for example, a flexible printed circuit, a fingerprint module, or a screen module. It should be noted that the electronic component herein may be a heating device or a non-heating device.

In an implementation, the capillary structure (liquid absorption core) in the vapor chamber is arranged at equal intervals. However, in an actual application process, a plurality of heat sources are provided in the mobile terminal, so that a plurality of evaporation regions are provided and are not interconnected, hindering the cooling medium from flowing back to the evaporation region from the condensation region. Therefore, it is difficult to ensure that the cooling medium returns to the evaporation region in which the heat source is located, and cooling performance of the large area vapor chamber is reduced.

As shown in FIG. 28b to FIG. 28e, in another implementation, the capillary structure 30 in the vapor chamber includes a first capillary structure 31 and a second capillary structure 32, where the first capillary structure 31 is at least one of copper powder, foamy copper, and copper mesh, and is flat laid on an inner surface of the first cover plate 10 and/or the second cover plate 20. The second capillary structure 32 is copper fiber, and is disposed in the sealed cavity 40 in a fibrous extending and dispersing manner. The second capillary structure 32 radiates to the condensation region from a plurality of evaporation regions. In addition, the capillary structure keeps a continuous state and the capillary structure is prevented from being blocked by a mounting hole 72 or a mounting recess 71 of the vapor chamber 100, so as to ensure that the cooling medium of the condensation region can flow back to the evaporation region. In addition, the second capillary structure 32 is densely arranged in the small area evaporation region and comparatively sparsely arranged in the large area condensation region, so as to improve cooling performance of the vapor chamber 100.

Figure 29A:
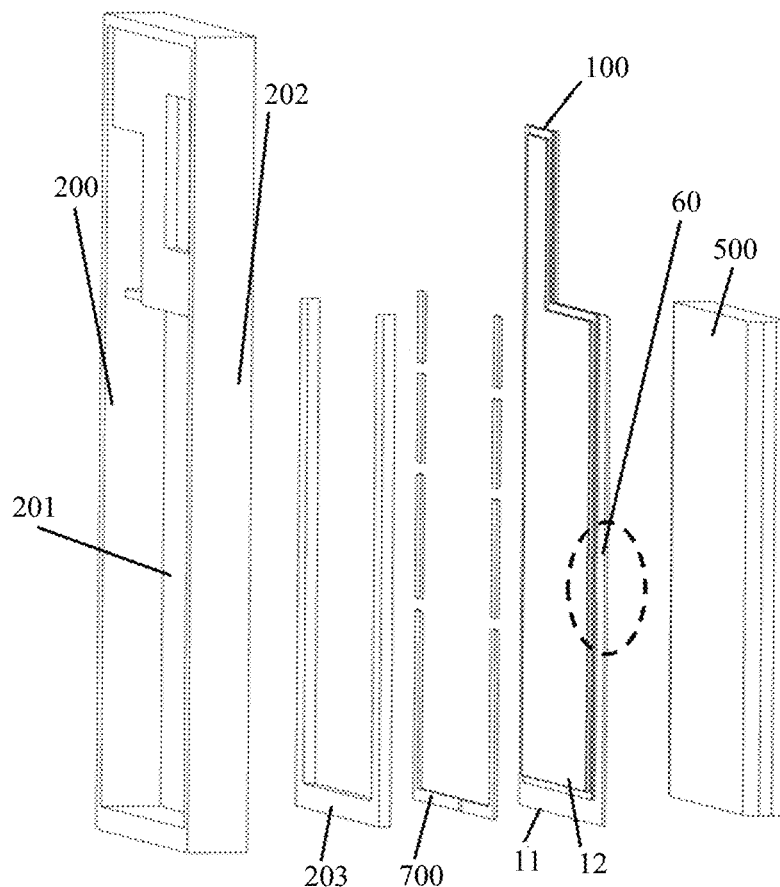
FIG. 29a is an exploded view of a mobile terminal according to an embodiment of this application.

FIG. 29a is a schematic exploded view of a middle frame of a mobile terminal according to this application. As shown in FIG. 29a, the middle frame 200 includes a middle frame side wall 202 and a middle frame extension member 203 connected to the middle frame side wall 202, where the middle frame extension member 203 is configured to optimize and reinforce a high stress region of the middle frame 200. Specifically, the middle frame 200 includes four side walls 202, including two first side walls in a length direction of the mobile terminal and two second side walls in a width direction of the mobile terminal. In a specific implementation, the middle frame extension member 203 is connected to the two first side walls and one of the second side walls.

Specifically, the middle frame extension member 203 is connected to a side of the middle frame side wall 202 facing towards the through-hole 201. A material of the middle frame extension member 203 may be metal or alloy material such as aluminum alloy, stainless steel, titanium alloy, or copper alloy. The middle frame extension member 203 may construct an I-shaped reinforcing structure for the middle frame and can, as compared to the middle frame side wall 202 alone for supporting, greatly improve overall rigidity and strength of the middle frame, improve torsional stiffness and impact stiffness of the middle frame, and stably support the battery, the display screen, and the like on two sides of the middle frame.

Figure 29B:
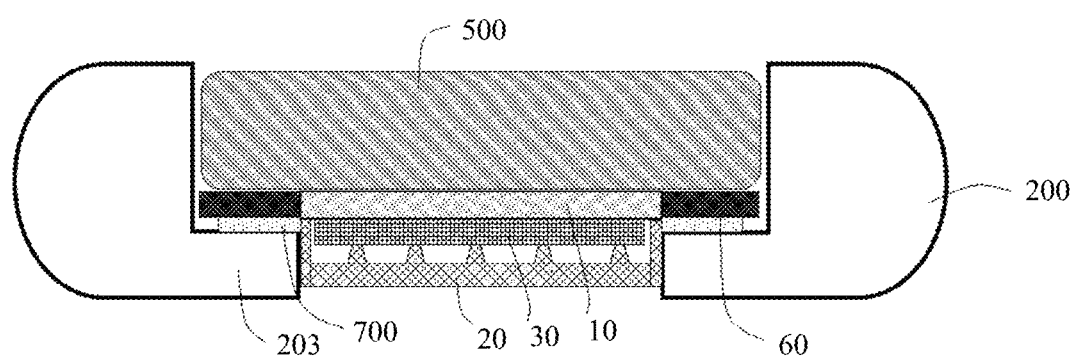
FIG. 29b is a sectional view of a mobile terminal according to an embodiment of this application.
Figure 29C:
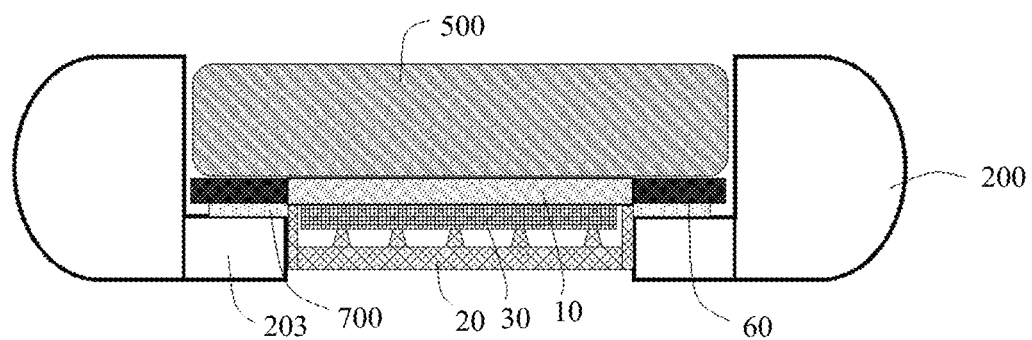
FIG. 29c is another sectional view of a mobile terminal according to an embodiment of this application.
Figure 30C:
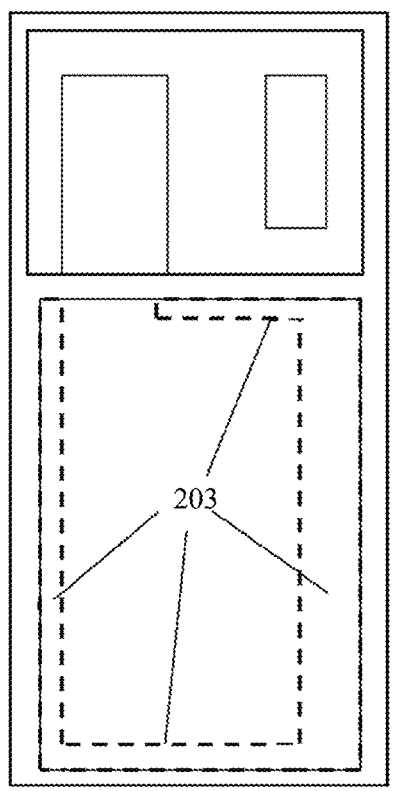
Figure 30D:
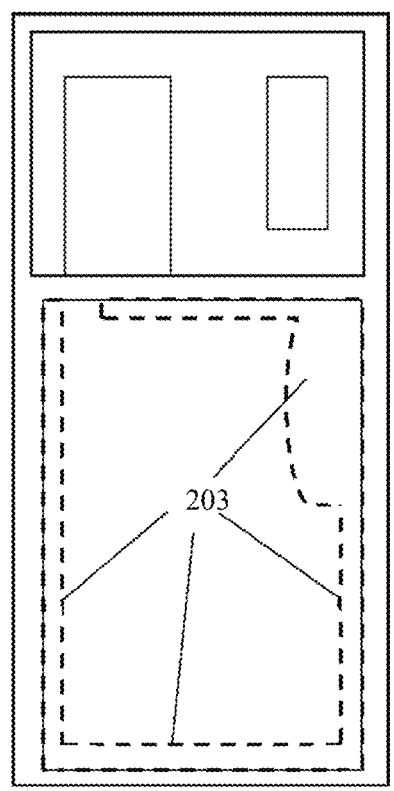

As shown in FIG. 29b and FIG. 29c, the middle frame extension member 203 and the middle frame side wall 202 are integrally machined, or the middle frame extension member 203 and the middle frame side wall 202 are separately machined and molded, and then fixedly connected through injection molding, screwing, welding, bonding, or the like.

Optionally, an extension length of the middle frame extension member 203 in the width direction of the mobile terminal ranges from 0.5 mm to 50 mm, and an extension length in the length direction of the mobile terminal ranges from 0.5 mm to 50 mm, specifically may be 0.5 mm, 1.0 mm, 2.0 mm, 5.0 mm, 10 mm, 20 mm, 30 mm, 50 mm, or the like, and may be adjusted based on specific actual needs. A thickness of the middle frame extension member 203 is less than a thickness of the middle frame side wall 202.

In this embodiment, the vapor chamber 100 further includes a step fixing part 60 formed by extending along at least a part of an edge of the vapor chamber. After the middle frame extension member 203 and the middle frame side wall 202 are fixed into a whole, the vapor chamber 100 is disposed on the middle frame extension member 203, and the step fixing part 60 of the vapor chamber 100 is fixedly connected to the middle frame extension member 203 through welding, dispensing, riveting, injection molding, or the like.

Optionally, in a thickness direction of the mobile terminal, a sum of a thickness of the middle frame extension member 203 and a thickness of the step fixing part 60 is greater than or equal to a thickness of the vapor chamber 100.

In an embodiment, an edge of the first cover plate 11 extends to form the step fixing part 60, and the step fixing part 60 is connected to the middle frame extension member 203. The first cover plate 11 is made of a high-strength composite material. The second cover plate 12 is made of copper or copper alloy, or the second cover plate 12 may be made of a high-strength composite material.

FIG. 30a to FIG. 30d each are a schematic state diagram illustrating distribution of a middle frame extension member of a mobile terminal according to an embodiment of this application. As shown in FIG. 30a to FIG. 30d, the middle frame extension member 203 may be rectangular frame shaped, U-type frame shaped, or other irregular shaped. The middle frame extension member 203 may be a regular continuous straight side, where the continuous straight side may be arranged by equal or unequal width; or the middle frame extension member 203 may be a discontinuous straight side, where the discontinuous straight side may also be arranged by equal or unequal width; or the middle frame extension member 203 may be partially optimized and reinforced to an irregular shape based on requirements for strength and stress of the middle frame. This is not limited herein.

Figure 31A:
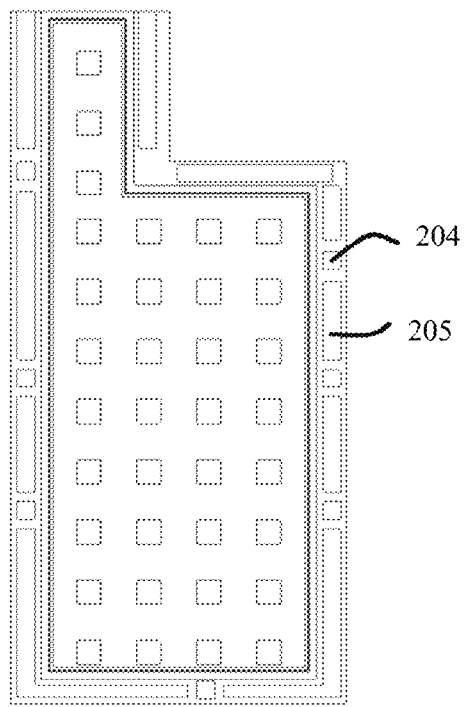
FIG. 31a and FIG. 31b each are a schematic structural diagram illustrating distribution of electrical connection points on a middle frame of a mobile terminal according to an embodiment of this application.
Figure 31B:
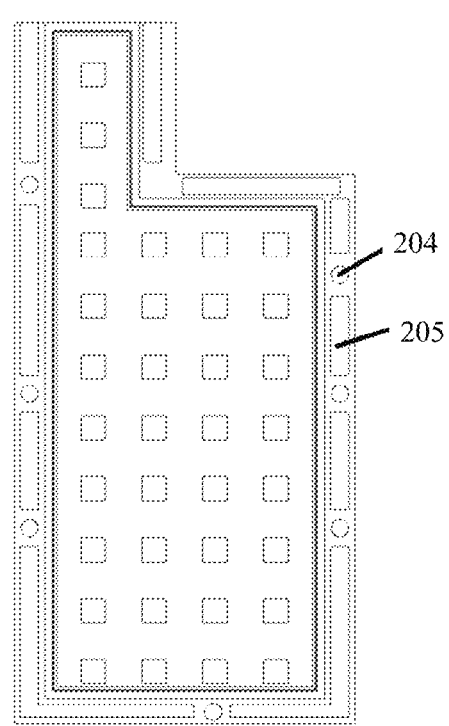

FIG. 31a and FIG. 31b each are a schematic state diagram illustrating distribution of electrical connection points on a middle frame of a mobile terminal according to an embodiment of this application. As shown in FIG. 31a and FIG. 31b, several electrical connection points 204 are arranged on the middle frame extension member 203 and/or the step fixing part 60, where an implementation manner of the electrical connection points may be a conductive medium such as conductive adhesive or gild reed, the electrical connection points may be square, circular, rhombus, rectangular, or the like, and the middle frame extension member may be connected to the electrical connection points through riveting, welding, or the like, so that the middle frame is electrically connected to other electronic component. The electrical connection points 204 may be arranged discontinuously in series or arranged in parallel. This is not limited herein.

To prevent the electrical connection points from interference, an insulation protection layer 205 is provided on a region of the middle frame extension member 203 and/or the step fixing part 60 outside the electrical connection points, where interface resistance of the insulation protection layer 205 is greater than 500Ω. In a specific implementation, a region may be covered through anodizing, ink, nonmetallic organic matter, or the like to form the insulation protection layer 205.

Because the vapor chamber 100 fully covers a battery region and a circuit board region, for ease of assembling, as shown in FIG. 29b, the mobile terminal further includes a connecting layer 700 for connecting the step fixing part 60 of the vapor chamber 100 and the middle frame extension member 203, where the connecting layer 700 may be a bonding layer, a welding layer, or the like. It may be understood that when the connecting layer 700 is disposed between the middle frame extension member 203 and the step fixing part 60, a sum of a thickness of the middle frame extension member 203, a thickness of the connecting layer 700, and a thickness of the step fixing part 60 is greater than or equal to a thickness of the vapor chamber 100.

After a transverse bar is partially cut off or fully cut off, a battery compartment cooperating with the cover plate of the vapor chamber 100 is fixed to a partial structure of the middle frame through screwing, welding, dispensing, or the like.

In this embodiment, the vapor chamber 100 is connected to the middle frame extension member 203 by using the step fixing part 60, and specifically may be fixed to the middle frame extension member 203 through dispensing, welding, riveting, or the like, so that the vapor chamber 100 and the middle frame 200 are connected into a whole. The circuit board 400 and the battery 500 are flat laid on a surface of a side of the cover plate of the vapor chamber 100 away from the middle frame extension member 203.

FIG. 32a and FIG. 32b each are a partial schematic exploded view of a middle frame of a mobile terminal and a vapor chamber according to an embodiment of this application. As shown in FIG. 32a, in an implementation, the connecting layer 700 may be disposed on a surface of the step fixing part 60 of the vapor chamber 100 facing towards the middle frame extension member 203, so as to more stably connect the middle frame extension member 203 and the vapor chamber 100.

As shown in FIG. 32b, in another implementation, the connecting layer 700 may include a first connecting layer 701 and a second connecting layer 702, where the first connecting layer 701 is disposed on a surface of the step fixing part 60 of the vapor chamber 100 facing towards the middle frame extension member 203, and is corresponding to a battery 500 arrangement region of the vapor chamber 100. The second connecting layer 702 is disposed on a surface of the step fixing part 60 of the vapor chamber 100 away from the middle frame extension member 203, and is corresponding to a circuit board 400 arrangement region of the vapor chamber 100.

In an actual assembly and application process, an overhang region of the battery (a region 6 mm to 10 mm long from a head edge or a tail edge of the battery is an overhang region of the battery) has a segment difference greater than 0.05 mm and is located on a hollowed-out edge of the middle frame, so that complete control over a sharp edge of a metal material is not guaranteed, and the battery 500 is prone to problems such as indentations, bumps or even punctures in high temperature, high humidity and falling process, causing short circuit fire.

To avoid the foregoing problem, FIG. 33 is a schematic structural diagram of a neighboring position of a middle frame and a vapor chamber according to an embodiment of this application. As shown in FIG. 33, slight edge pressing design such as arc/chamfer transition or arc/chamber composite edge folding is applied to an edge of the step fixing part 60 of the vapor chamber 100 that is in contact with the middle frame side wall 202, so that the contact edge is lower than a largest side, where an arc edge radius ranges from 0.05 mm to 1 mm. Therefore, the overhang region of the battery can be effectively protected against external force, and safety of the battery is effectively protected.

Figure 34A:
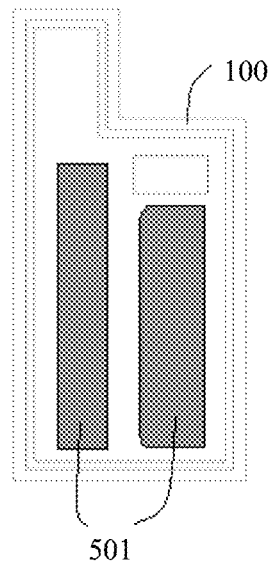
FIG. 34a to FIG. 34c each are a schematic diagram illustrating distribution of a battery adhesive of a mobile terminal according to an embodiment of this application.
Figure 34B:
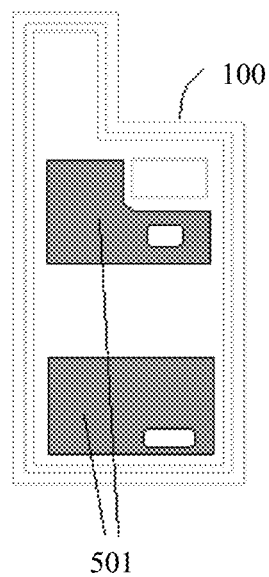
Figure 34C:
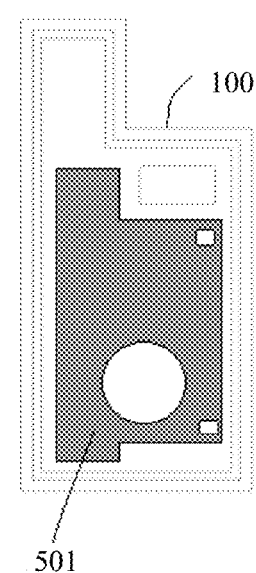

FIG. 34a to FIG. 34c each are a schematic structural diagram illustrating connection of a vapor chamber and a battery according to an embodiment of this application. As shown in FIG. 34a to FIG. 34c, the battery 500 may be attached and fixed to a surface of a side of the vapor chamber 100 away from the middle frame extension member 203 by using battery adhesive 501, where the battery adhesive does not need to be provided on the middle frame side wall 202 or a battery cover, the middle frame side wall and the battery cover are not load-bearing members of the battery 500, and the middle frame 200 and the vapor chamber 100 may serve as load-bearing members of the battery 500.

In a specific implementation, an arrangement region of the battery adhesive on the vapor chamber 100 may be adjusted based on mounting requirements of all electronic components in the mobile terminal. The battery adhesive may be regular shaped or irregular shaped, may be one-piece battery adhesive, or may be spliced battery adhesive. This is not limited herein. In the case of one-piece battery adhesive, a hole or a slot may be provided in the one-piece battery adhesive based on requirements of the component such as a flexible printed circuit, a fingerprint module, or a screen device, so as to be adapted to stacking and inserting of the electronic component.

The foregoing descriptions are merely examples of specific implementations of this application, but are not intended to limit the protection scope of this application. Any variation or replacement readily figured out by persons skilled in the art within the technical scope disclosed by this application should fall within the protection scope of this application. Therefore, the protection scope of this application shall be subject to the protection scope of the claims.

What is claimed is:

1. A vapor chamber, comprising:
    a housing comprising a first cover plate and a second cover plate, wherein the first cover plate and the second cover plate are connected and define a sealed cavity;
    a cooling medium;
    a capillary structure disposed in the sealed cavity; and
    a supporting structure extending from an inner surface of the housing into an internal space of the housing;
    wherein a material of the first cover plate and the second cover plate is a high-strength composite material, wherein the high-strength composite material comprises a first material layer and a second material layer, wherein the strength of the first material layer is higher than the strength of the second material layer, a material of the first material layer is stainless steel, titanium, titanium alloy, tungsten, tungsten alloy, chromium, or chromium alloy, a material of the second material layer is copper or copper alloy, and wherein the second material layer is located on an inner side of the housing and separates the first material layer from the cooling medium; and wherein a material of an inner core of the supporting structure is the material of the first material layer, and a material of a periphery of the supporting structure is the material of the second material layer.

2. The vapor chamber according to claim 1, wherein the supporting structure abuts against the first cover plate and the second cover plate.

3. The vapor chamber according to claim 1, wherein the supporting structure abuts against the capillary structure.

4. The vapor chamber according to claim 1, wherein the supporting structure and the housing are an integrated structure, and wherein the supporting structure comprises a plurality of protruding points arranged in an array.

5. The vapor chamber according to claim 1, wherein the second material layer of the first cover plate and the second material layer of the second cover plate enclose the sealed cavity.

6. The vapor chamber according to claim 1, wherein the capillary structure is a porous metallic medium.

7. The vapor chamber according to claim 6, wherein the capillary structure is one of copper mesh, copper fiber, copper powder, or foamy copper.

8. The vapor chamber according to claim 1, wherein the capillary structure is disposed on the second material layer of the first cover plate.

9. The vapor chamber according to claim 1, wherein the capillary structure is disposed on the second material layer of the first cover plate and the second cover plate.

10. A mobile terminal, comprising:
a middle frame;
a display screen;
a circuit board;
a battery; and
a vapor chamber;
wherein a through-hole extends in the middle frame, and the vapor chamber is embedded in the through-hole, and the vapor chamber and the middle frame jointly bear the display screen, the circuit board, and the battery; and
wherein the vapor chamber comprises:
a housing including a first cover plate and a second cover plate, wherein the first cover plate and the second cover plate are connected to form a sealed cavity chamber;
a cooling medium;
a capillary structure disposed in the sealed chamber; and
a supporting structure extending from an inner surface of the housing into an internal space of the housing;
wherein a material of the first cover plate and the second cover plate is a high-strength composite material, wherein the high-strength composite material comprises a first material layer and a second material layer, wherein the strength of the first material layer is higher than the strength of the second material layer, a material of the first material layer is stainless steel, titanium, titanium alloy, tungsten, tungsten alloy, chromium, or chromium alloy, and a material of the second material layer is copper or copper alloy, and wherein the second material layer is located on an inner side of the housing and separates the first material layer from the cooling medium; and
wherein a material of an inner core of the supporting structure is the material of the first material layer, and a material of a periphery of the supporting structure is the material of the second material layer.

11. The mobile terminal according to claim 10, wherein a connection manner of the vapor chamber and the middle frame comprises one of riveting, bonding, welding, lapping, or metal over-molding.

12. The mobile terminal according to claim 10, wherein the battery and the display screen are disposed on two sides of the vapor chamber in parallel respectively, and wherein the vapor chamber further comprises a battery surface facing towards the battery and a display surface facing towards the display screen, wherein the display screen and the display surface are parallel without contact.

13. The mobile terminal according to claim 10, wherein the supporting structure abuts against the first cover plate and the second cover plate.

14. The mobile terminal according to claim 10, wherein the supporting structure and the housing are an integrated structure, and wherein the supporting structure is a plurality of protruding points arranged in an array.

15. The mobile terminal according to claim 10, wherein the capillary structure is a porous metallic medium.

16. The mobile terminal according to claim 14, wherein the capillary structure is one of copper mesh, copper fiber, copper powder, or foamy copper.

* * * * *